United States Patent
Myers-Ward et al.

(10) Patent No.: US 12,469,699 B2
(45) Date of Patent: Nov. 11, 2025

(54) SYSTEMS AND METHODS FOR GROWTH OF SILICON CARBIDE OVER A LAYER COMPRISING GRAPHENE AND/OR HEXAGONAL BORON NITRIDE AND RELATED ARTICLES

(71) Applicants: Massachusetts Institute of Technology, Cambridge, MA (US); The Government of the United States of America, as Represented by the Secretary of the Navy, Arlington, VA (US); ROHM Co., Ltd., Kyoto (JP)

(72) Inventors: Rachael L. Myers-Ward, Arlington, VA (US); Jeehwan Kim, Cambridge, MA (US); Kuan Qiao, Cambridge, MA (US); Wei Kong, Cambridge, MA (US); David Kurt Gaskill, Alexandria, VA (US); Takuji Maekawa, Kyoto (JP); Noriyuki Masago, Kyoto (JP)

(73) Assignees: Massachusetts Institute of Technology, Cambridge, MA (US); The Government of the United States of America, as Represented by the Secretary of the Navy, Arlington, VA (US); ROHM Co., Ltd., Kyoto (JP)

( * ) Notice: Subject to any disclaimer, the term of this patent is extended or adjusted under 35 U.S.C. 154(b) by 0 days.

(21) Appl. No.: 18/486,471

(22) Filed: Oct. 13, 2023

(65) Prior Publication Data
US 2024/0153763 A1    May 9, 2024

Related U.S. Application Data

(63) Continuation of application No. 17/254,623, filed as application No. PCT/US2019/038461 on Jun. 21, 2019, now abandoned.
(Continued)

(51) Int. Cl.
*H01L 21/02*    (2006.01)

(52) U.S. Cl.
CPC .. *H01L 21/02529* (2013.01); *H01L 21/02378* (2013.01); *H01L 21/02389* (2013.01);
(Continued)

(58) Field of Classification Search
CPC ......... H01L 21/02529; H01L 21/02378; H01L 21/02389; H01L 21/02433;
(Continued)

(56) References Cited

U.S. PATENT DOCUMENTS

| | | | |
|---|---|---|---|
| 4,236,947 A | 12/1980 | Baliga | |
| 4,471,367 A | 9/1984 | Chen et al. | |

(Continued)

FOREIGN PATENT DOCUMENTS

| | | |
|---|---|---|
| CN | 102782856 A | 11/2012 |
| CN | 104393128 A | 3/2015 |

(Continued)

OTHER PUBLICATIONS

Japanese Notice of Reasons for Rejection mailed Apr. 26, 2024, for Application No. 2020-571551.
(Continued)

*Primary Examiner* — Christine S. Kim
*Assistant Examiner* — Cole Leon Lindsey
(74) *Attorney, Agent, or Firm* — Wolf, Greenfield & Sacks, P.C.

(57) ABSTRACT

Systems and methods for growth of silicon carbide over a layer comprising graphene and/or hexagonal boron nitride, and related articles, are generally described. In some embodiments, a SiC film is fabricated over a layer comprising graphene and/or hexagonal boron nitride, which in turn is disposed over a substrate. The layer and/or the substrate may be lattice-matched with the SiC film to reduce defect (Continued)

density in the SiC film. The fabricated SiC film may then be removed from the substrate via, for example, a stressor attached to the SiC film. In certain cases, the layer serves as a reusable platform for growing SiC films and also serves a release layer that allows fast, precise, and repeatable release at the layer surface.

16 Claims, 37 Drawing Sheets

Related U.S. Application Data

(60) Provisional application No. 62/688,472, filed on Jun. 22, 2018.

(52) U.S. Cl.
CPC .. *H01L 21/02433* (2013.01); *H01L 21/02444* (2013.01); *H01L 21/02458* (2013.01); *H01L 21/02502* (2013.01); *H01L 21/02598* (2013.01); *H01L 21/0262* (2013.01)

(58) Field of Classification Search
CPC ......... H01L 21/02444; H01L 21/02458; H01L 21/02502; H01L 21/02598; H01L 21/0262
See application file for complete search history.

(56) References Cited

U.S. PATENT DOCUMENTS

| | | | |
|---|---|---|---|
| 4,727,047 A | 2/1988 | Bozler et al. | |
| 5,114,745 A | 5/1992 | Jones | |
| 5,308,661 A | 5/1994 | Feng et al. | |
| 5,349,922 A | 9/1994 | Anthony et al. | |
| 5,391,257 A | 2/1995 | Sullivan et al. | |
| 5,443,032 A | 8/1995 | Vichr et al. | |
| 5,527,559 A | 6/1996 | Simpson | |
| 5,641,381 A | 6/1997 | Bailey et al. | |
| 5,792,254 A | 8/1998 | Windischmann | |
| 6,566,256 B1 | 5/2003 | Solomon et al. | |
| 8,906,772 B2 | 12/2014 | Sumant | |
| 8,916,451 B2 | 12/2014 | Bayram et al. | |
| 9,096,050 B2 | 8/2015 | Bedell et al. | |
| 9,988,313 B2* | 6/2018 | Miranzo | B82Y 30/00 |
| 9,991,113 B2 | 6/2018 | Kim et al. | |
| 10,176,991 B1 | 1/2019 | Lagally et al. | |
| 10,517,155 B2 | 12/2019 | Lee et al. | |
| 10,770,289 B2 | 9/2020 | Kim | |
| 10,903,073 B2 | 1/2021 | Kim et al. | |
| 11,063,073 B2 | 7/2021 | Lee et al. | |
| 2003/0052080 A1 | 3/2003 | Baik et al. | |
| 2005/0023646 A1 | 2/2005 | Lee et al. | |
| 2005/0109918 A1 | 5/2005 | Nikzad et al. | |
| 2006/0021565 A1 | 2/2006 | Zahler et al. | |
| 2007/0187694 A1 | 8/2007 | Pfeiffer | |
| 2008/0072817 A1* | 3/2008 | Zwieback | C30B 23/00 |
| | | | 117/951 |
| 2009/0045395 A1 | 2/2009 | Kim et al. | |
| 2009/0162549 A1 | 6/2009 | Fryda et al. | |
| 2009/0236619 A1 | 9/2009 | Chakroborty | |
| 2010/0224950 A1 | 9/2010 | Dinyari et al. | |
| 2011/0030991 A1 | 2/2011 | Veerasamy | |
| 2011/0108954 A1 | 5/2011 | Spiberg et al. | |
| 2011/0244662 A1 | 10/2011 | Lee et al. | |
| 2011/0294281 A1 | 12/2011 | Zang et al. | |
| 2012/0141799 A1* | 6/2012 | Kub | H10F 10/16 |
| | | | 977/734 |
| 2012/0238083 A1 | 9/2012 | Pan | |
| 2013/0001731 A1 | 1/2013 | Forrest et al. | |
| 2013/0001748 A1 | 1/2013 | Faurie et al. | |
| 2013/0143396 A1* | 6/2013 | Sudarshan | H01L 21/02378 |
| | | | 438/503 |
| 2013/0143397 A1 | 6/2013 | Fuller et al. | |
| 2013/0285016 A1 | 10/2013 | Wei et al. | |
| 2013/0285115 A1 | 10/2013 | Wei et al. | |
| 2013/0288458 A1 | 10/2013 | Wei et al. | |
| 2013/0316488 A1 | 11/2013 | Bedell et al. | |
| 2014/0001152 A1 | 1/2014 | Zurutuza Elorza et al. | |
| 2014/0014171 A1 | 1/2014 | Alam et al. | |
| 2014/0038392 A1 | 2/2014 | Yonehara et al. | |
| 2014/0220764 A1 | 8/2014 | Bayram et al. | |
| 2014/0237570 A1 | 8/2014 | Shishkov et al. | |
| 2014/0291282 A1 | 10/2014 | Bedell et al. | |
| 2014/0339506 A1 | 11/2014 | Dimitrakopoulos et al. | |
| 2014/0339580 A1 | 11/2014 | Park et al. | |
| 2014/0342127 A1 | 11/2014 | Dimitrakopulous et al. | |
| 2015/0084074 A1* | 3/2015 | Bayram | H10H 20/825 |
| | | | 257/94 |
| 2015/0122659 A1 | 5/2015 | Kula et al. | |
| 2015/0171234 A1 | 6/2015 | Ushinsky et al. | |
| 2015/0179968 A1 | 6/2015 | Forrest et al. | |
| 2015/0228728 A1 | 8/2015 | Dimitrakopoulos et al. | |
| 2015/0228848 A1 | 8/2015 | Miyoshi et al. | |
| 2015/0299852 A1 | 10/2015 | Ozkan et al. | |
| 2016/0028022 A1 | 1/2016 | Seo | |
| 2016/0064489 A1 | 3/2016 | Zhang et al. | |
| 2016/0076169 A1 | 3/2016 | Hashimoto et al. | |
| 2016/0093491 A1 | 3/2016 | Choi et al. | |
| 2016/0126317 A1 | 5/2016 | Kim et al. | |
| 2016/0163566 A1 | 6/2016 | Chen et al. | |
| 2016/0268128 A1 | 9/2016 | Cheng et al. | |
| 2016/0329457 A1 | 11/2016 | Forrest et al. | |
| 2016/0333472 A1 | 11/2016 | Xu et al. | |
| 2016/0351747 A1 | 12/2016 | Forrest et al. | |
| 2017/0018614 A1* | 1/2017 | Rupp | H10D 62/8325 |
| 2017/0077339 A1 | 3/2017 | Ma et al. | |
| 2017/0352538 A1 | 12/2017 | Kim et al. | |
| 2018/0114803 A1 | 4/2018 | Forrest et al. | |
| 2018/0197736 A1* | 7/2018 | Kim | H01L 21/0254 |
| 2019/0259608 A1 | 8/2019 | Kim et al. | |
| 2019/0363514 A1 | 11/2019 | Kim et al. | |
| 2019/0386044 A1 | 12/2019 | Lee et al. | |
| 2020/0043790 A1 | 2/2020 | Lee et al. | |
| 2020/0135962 A1 | 4/2020 | Lee et al. | |
| 2020/0286786 A1 | 9/2020 | Kim et al. | |
| 2021/0125826 A1 | 4/2021 | Myers-Ward et al. | |
| 2022/0157661 A1 | 5/2022 | Kim et al. | |

FOREIGN PATENT DOCUMENTS

| | | |
|---|---|---|
| JP | 2011-009268 A | 1/2011 |
| JP | 2011-009281 A | 1/2011 |
| JP | 2013-124215 A | 6/2013 |
| JP | 2013-180930 A | 9/2013 |
| JP | 2014-237570 A | 12/2014 |
| KR | 10-2013-0090114 A | 8/2013 |
| WO | WO 2011/112300 A1 | 9/2011 |
| WO | WO 2013/088948 A1 | 6/2013 |
| WO | WO 2014/190352 A1 | 11/2014 |
| WO | WO 2016/039541 A1 | 3/2016 |
| WO | WO 2016/058037 A1 | 4/2016 |
| WO | WO 2017/044577 A1 | 3/2017 |
| WO | WO 2017/222796 A2 | 12/2017 |
| WO | WO 2018/089444 A1 | 5/2018 |
| WO | WO 2018/089450 A1 | 5/2018 |
| WO | WO 2018/156876 a1 | 8/2018 |
| WO | WO 2018/156877 A1 | 8/2018 |
| WO | WO 2018/195152 A1 | 10/2018 |
| WO | WO 2018/195412 A1 | 10/2018 |
| WO | WO 2019/099461 A9 | 5/2019 |
| WO | WO 2019/246515 A1 | 12/2019 |

OTHER PUBLICATIONS

Japanese Office Action mailed Jul. 26, 2023, for Application No. JP2020-571551.
International Search Report and Written Opinion mailed Aug. 28, 2019, for Application No. PCT/US2019/038461.
International Preliminary Report on Patentability mailed Dec. 30, 2020, for Application No. PCT/US2019/038461.

(56) References Cited

OTHER PUBLICATIONS

Adams et al., Demonstration of multiple substrate reuses for inverted metamorphic solar cells. IEEE J Photovolt. 2013;3(2):899-903. 6 pages.

Ait-Mansour et al., Ge epitaxial island growth on a graphitized C-rich 4H—SiC(0 0 0 1) surface. J Cryst Growth. Feb. 2005;275(1-2):e2275-80. Epub Jan. 7, 2005.

Alaskar et al., Theoretical and experimental study of highly textured GaAs on silicon using a graphene buffer layer. J Crystal Growth. Sep. 1, 2015;425:268-73. Epub Feb. 9, 2015.

Alaskar et al., Towards van der Waals epitaxial growth of GaAs on Si using a graphene buffer layer. Adv Funct Mater. Wiley-VCH Verlag GmbH. Nov. 12, 2014; 24(42): 6629-38.

Avouris et al., Graphene: synthesis and applications. Materials Today. Mar. 2012;15(3):86-97.

Balmer et al., Chemical vapour deposition synthetic diamond: Materials, technology and applications. J Phys Condens Matter. Aug. 2009;21(346):364221(1-3).

Barton et al., Transition metal dichalcogenide and hexagonal boron nitride heterostructures grown by molecular beam epitaxy Microelectronic Engineering. 2015;147:306-9. doi: 10.1016/j.mee.2015.04.105. Epub May 5, 2015.

Bedell et al., Vertical light-emitting diode fabrication by controlled spalling. Appl Phys Exp. 2013;6(11):112301(1-4). Epub Oct. 18, 2013.

Bedell et al., Layer transfer by controlled spalling. J Phys D: Appl Phys. 2013;46(15):152002(1-6).

Bedell et al., Kerf-less removal of Si, Ge, and III-V layers by controlled spalling to enable low-cost PV technologies. IEEE J Photovolt. Apr. 2012;2(2):141-7.

Berger et al., Ultrathin epitaxial graphite: 2D electron gas properties and a route toward graphene-based nanoelectronics. J Phys Chem B. 2004;108(52):19912-6. Epub Dec. 3, 2004.

Cheng et al., Epitaxial lift-off process for gallium arsenide substrate reuse and flexible electronics. Nat Commun. 2013;4:1577(1-7). Epub Mar. 12, 2013.

Chun et al., Vertically Stacked Color Tunable Light-Emitting Diodes Fabricated Using Wafer Bonding and Transfer Printing. ACS Appl Mater Interfaces. Nov. 3, 2014;6:19482-7. doi: dx.doi.org/10.1021/am505415q.

Chung et al., Transferable GaN layers grown on ZnO-coated graphene layers for optoelectronic devices. Science. Oct. 29, 2010;330(6004):655-7. doi: 10.1126/science.1195403.

De Heer et al., Epitaxial graphene. Solid State Commun. 2007;143(1-2):92-100. Epub Apr. 27, 2007.

Diebold et al., Growth and characterization of GaAs on Sapphire (0001) by molecular beam epitaxy. Surf Interf Anal. Feb. 1990;15(2):150-8.

Distler, The real structure of crystals and selective nucleation at surface local long range active centres. J Cryst Growth. 1968;3:175-9.

Distler et al., Polarization structure of interfacial amorphous films. Nature. Jan. 4, 1969;221:52-3.

Distler et al., Oriented crystallization of AgCl on amorphous polyvinyl chloride replicas of NaCl single crystal surfaces. Thin Solid Films. 1970;6:203-11.

Emtsev et al., Towards wafer-size graphene layers by atmospheric pressure graphitization of silicon carbide. Nat Mater. Mar. 2009;8(3):203-7. doi: 10.1038/nmat2382. Epub Feb. 8, 2009.

Fan et al., Flexible Thin-Film InGaAs Photodiode Focal Plane Array. ACS Photonics. Mar. 16, 2016;3(4):670-6.

Fabbri et al., Effects of single-layer Shockley stacking faults on the transport properties of high-purity semi-insulating 4H—SiC. J Appl Phys. 2010;108:013702. Epub Jul. 2, 2010. 4 pages.

Freund et al., Thin film materials: Stress, defect formation and surface evolution. Cambridge Univ Press. 2009. 820 pages.

Fuchs et al., Engineering near-infrared single-photon emitters with optically active spins in ultrapure silicon carbide. Nat Comm. Jul. 7, 2015;6:7578, 7 pages.

Greaving, Fabrication and characterization of diamond thin films as nanocarbon transistor substrates. Master's Thesis. Vanderbilt University. 48 pages. Aug. 2013.

Henning, Orientation of vacuum condensed overgrowths through amorphous layers. Nature. Sep. 12, 1970;227:1129-31.

Iida et al., Laser lift-off technique for freestanding GaN substrate using an In droplet formed by thermal decomposition of GaInN and its application to light-emitting diodes. Appl Phys Lett. 2014;105:072101(1-4). Epub Aug. 18, 2014.

Kayes et al., Flexible thin-film tandem solar cells with >30% efficiency. IEEE J Photovolt. Mar. 2014;4(2):729-33.

Kim et al., Engineering of contact resistance between transparent single-walled carbon nanotube films and a-Si:H single junction solar cells by gold nanodots. Adv Mater. Apr. 10, 2012;24(14):1899-902. doi: 10.1002/adma.201104677. Epub Mar. 5, 2012.

Kim et al., 9.4% efficient amorphous silicon solar cell on high aspect-ratio glass microcones. Adv Mater. Jun. 2014;26(24):4082-6. Epub Mar. 20, 2014.

Kim et al., High efficiency Cu2ZnSn(S,Se)4 solar cells by applying a double In2S3/CdS emitter. Adv Mater. Nov. 2014;26(44):7427-31. Epub Aug. 25, 2014.

Kim et al., Fabrication of dislocation-free tensile strained Si thin films using controllably oxidized porous Si substrates. Appl Phys Lett. 2006;89(15):152117(1-3). Epub Oct. 12, 2006.

Kim et al., A method for fabricating dislocation-free tensile-strained SiGe films via the oxidation of porous Si substrates. Appl Phys Lett. 2007;91(25):252108(1-3). Epub Dec. 19, 2007.

Kim et al., 10.5% efficient polymer and amorphous silicon hybrid tandem photovoltaic cell. Nat Commun. 2015;6:6391(1-6). doi: 10.1038/ncomms7391. 6 pages. Epub Mar. 4, 2015.

Kim et al., Principle of direct van der Waals epitaxy of single-crystalline films on epitaxial graphene. Nat Commun. Sep. 2014;5:4836. doi:10.1038/ncomms5836, 7 pages.

Kim et al., Layer-resolved graphene transfer via engineered strain layers. Science. Nov. 15, 2013;342(6160):833-6.

Kim et al., Remote epitaxy through graphene enables two-dimensional material-based layer transfer. Nature. Apr. 20, 2017;544(7650):340-3. doi: 10.1038/nature22053. Methods included. 12 pages total.

Kong et al., Polarity governs atomic interaction through two-dimensional materials. Nat Mater. Nov. 2018;17:999-1005.

Lee et al., Natural substrate lift-off technique for vertical light-emitting diodes. Appl Phys Exp. 2014;7(4):042103(1-4). Epub Mar. 14, 2014.

Lee et al., Reuse of GaAs substrates for epitaxial lift-off by employing protection layers. J Appl Phys. 2012;111(3):033527(1-6). Epub Feb. 15, 2012.

Lee et al., Wafer-scale growth of single-crystal monolayer graphene on reusable hydrogen-terminated germanium. Science. Apr. 18, 2014;344(6181):286-9.

Lin et al., Direct synthesis of van der Waals solids. ACS Nano. Apr. 22, 2014;8(4):3715-23. doi: 10.1021/nn5003858. Epub Mar. 18, 2014.

Loher et al., Van der Waals epitaxy of three-dimensional CdS on the two-dimensional layered substrate MoTe2(0001). Appl Phys Lett. Aug. 1, 1994;65(5):555-7.

Nakamura et al., GaN growth using GaN buffer layer. Jap J Appl Phys. Oct. 1991;30(10A):L1705-7.

Nicoara et al. Growth of ordered molecular layers of PTCDA on Pb/Si(111) surfaces: a scanning tunneling microscopy study. Nanotechnology. Sep. 9, 2016;27(36):365706. 13 pages. doi: 10.1088/0957-4484/27/36/365706. Epub Aug. 2, 2016.

Norimatsu et al., Transitional structures of the interface between graphene and 6H—SiC (0 0 0 1). Chem Phys Letters. Jan. 13, 2009;468(1-3):52-6. DOI: 10.1016/j.cplett.2008.11.095.

Nyakiti et al., Enabling graphene-based technologies: Toward wafer-scale production of epitaxial graphene. MRS Bulletin. Nov. 23, 2012; 37:1149-57.

Schlaf et al., Molecular beam epitaxy growth of thin films of SnS2 and SnSe2 on cleaved mica and the basal planes of single-crystal layered semiconductors: Reflection high-energy electron diffraction, low-energy electron diffraction, photoemission, and scanning

(56) References Cited

OTHER PUBLICATIONS tunneling microscopy/atomic force microscopy characterization. J Vac Sci Technol A. May/Jun. 1995;13(3):1761-7.
Shahrjerdi et al., Ultralight high-efficiency flexible InGaP/(In)GaAs tandem solar cells on plastic. Adv Energy Mater. May 2013;3(5):566-71.
Shahrjerdi et al., Extremely flexible nanoscale ultrathin body silicon integrated circuits on plastic. Nano Lett. 2013;13:315-20. Epub Dec. 18, 2012.
Suo et al., Steady-state cracking in brittle substrates beneath adherent films. Int J Solid Structures. 1989;25(11):1337-53.
Tanaka et al., Anisotropic layer-by-layer growth of graphene on vicinal SiC(0001) surfaces. Phys Rev B. Jan. 2010;81(4):041406R(1-4).
Thouless et al., The edge cracking and spalling of brittle plates. Acta Metall. 1987;35(6):1333-41.
Ueda et al., Separation of thin GaN from sapphire by laser lift-off technique. Jap J Appl Phys. 2011;50(4R):041001(1-6). Epub Apr. 20, 2011.
Ueno et al., Epitaxial growth of transition metal dichalcogenides on cleaved faces of mica. J Vac Sci Technol A. Jan./Feb. 1990;8(1):68-72.
Vishwanath et al., Controllable growth of layered selenide and telluride heterostructures and superlattices using molecular beam epitaxy. J Mater Res. Apr. 14, 2016;31(7):900-10.
Wang et al., Direct growth of graphene film on germanium substrate. Sci Rep. 2013;3:2465(1-6). doi: 10.1038/srep02465. Epub Aug. 19, 2013.
Yablonovitch et al., Extreme selectivity in the lift-off of epitaxial GaAs films. Appl Phys Lett. Dec. 28, 1987;51(26):2222-4.
Office Action for CN Application No. 201680059078.8 dated Aug. 3, 2022.
Office Action for CN Application No. 201680059078.8 dated May 31, 2023.
Office Action for CN Application No. 201680059078.8 dated Mar. 8, 2024.
Office Action for CN Application No. 201680059078.8 dated Jun. 26, 2024.
Extended European Search Report for EP Application No. 16845018.7 dated Aug. 23, 2019.
Office Action for EP Application No. 16845018.7 dated Dec. 7, 2021.
Office Action for EP Application No. 22179687.3 dated Oct. 17, 2022.
Extended European Search Report for EP Application No. 22179687.3 dated May 23, 2023.
Office Action for JP Application No. 2018-512205 dated Dec. 7, 2020.
Notice of Allowance for JP Application No. 2018-512205 dated Jul. 5, 2021.
Office Action for KR Application No. 10-2018-7010014 dated Feb. 21, 2024.
Notice of Allowance for KR Application No. 10-2018-7010014 dated Feb. 13, 2025.
Office Action for JP Application No. 2020-571551 dated Jan. 24, 2025.
Invitation to Pay Additional Fees for International Application No. PCT/US2016/050701 dated Oct. 19, 2016.
International Search Report and Written Opinion for International Application No. PCT/US2016/050701 dated Jan. 19, 2017.
International Preliminary Report on Patentability (Chapter 1) for International Application No. PCT/US2016/050701 dated Mar. 22, 2018.

\* cited by examiner

Gray Scale Map Type:<none>

Color Coded Map Type: Inverse Pole Figure [100]
Silicon Carbide 4H

Boundaries <none>

Gray Scale Map Type:<none>

Color Coded Map Type: Inverse Pole Figure [001]
Silicon Carbide 4H

Boundaries <none>

Ref: Pseudo-graphene

↑ A1
← A2

Gray Scale Map Type:<none>

Color Coded Map Type: Inverse Pole Figure [001]
Silicon Carbide 4H

Boundaries <none>

A1 ↑
← A2

Gray Scale Map Type:<none>

Color Coded Map Type: Inverse Pole Figure [001]
Silicon Carbide 4H

Boundaries <none>

SYSTEMS AND METHODS FOR GROWTH OF SILICON CARBIDE OVER A LAYER COMPRISING GRAPHENE AND/OR HEXAGONAL BORON NITRIDE AND RELATED ARTICLES

CROSS-REFERENCES TO RELATED APPLICATIONS

This application is a continuation of U.S. patent application Ser. No. 17/254,623, filed Dec. 21, 2020, and entitled "SYSTEMS AND METHODS FOR GROWTH OF SILICON CARBIDE OVER A LAYER COMPRISING GRAPHENE AND/OR HEXAGONAL BORON NITRIDE AND RELATED ARTICLES," which is a national stage filing under 35 U.S.C. § 371 of International Patent Application No. PCT/US2019/038461, filed Jun. 21, 2019, and entitled "SYSTEMS AND METHODS FOR GROWTH OF SILICON CARBIDE OVER A LAYER COMPRISING GRAPHENE AND/OR HEXAGONAL BORON NITRIDE AND RELATED ARTICLES," which claims priority under 35 U.S.C. § 119(e) to U.S. Provisional Patent Application Ser. No. 62/688,472, filed Jun. 22, 2018, and entitled "REDUCTION OF BASAL PLANE DISLOCATIONS IN EPITAXIAL SIC USING AN IN-SITU ETCH PROCESS," each of which is incorporated herein by reference in its entirety for all purposes.

FIELD

Systems and methods for growth of silicon carbide over a layer comprising graphene and/or hexagonal boron nitride, and related articles, are generally described.

BACKGROUND

In advanced electronic and photonic technologies, devices are usually fabricated from functional semiconductors, such as compound semiconductors including at least two chemical elements. The lattice constants of these functional semiconductors typically do not match the lattice constants of silicon substrates. As understood in the art, lattice constant mismatch between a substrate and an epitaxial layer (epilayer) on the substrate can introduce strain into the epitaxial layer, thereby preventing epitaxial growth of thicker layers without defects. Therefore, non-silicon (non-Si) substrates are usually employed as seeds for epitaxial growth of most functional semiconductors. However, non-Si substrates with lattice constants matching those of functional materials can be costly and therefore limit the development of non-Si electronic/photonic devices.

One method to address the high cost of non-silicon substrates is the "layer-transfer" technique, in which functional device layers are grown on lattice-matched substrates and then removed and transferred to other substrates. The remaining lattice-matched substrates can then be reused to fabricate another device layer, thereby reducing the cost. To significantly reduce manufacturing costs, it can be desirable for a layer-transfer method to have the following properties: 1) substrate reusability; 2) a minimal substrate refurbishment step after the layer release; 3) a fast release rate; and 4) precise control of release thickness.

Conventional methods to remove and transfer a device layer from a lattice-matched substrate include chemical lift-off (also referred to as epitaxial lift-off or ELO), optical lift-off (also referred to as laser lift-off or LLO, and mechanical lift-off (also referred to as controlled spalling). Unfortunately, none of these methods has the four desired properties at the same time.

Despite its continuous development over the last three decades, chemical lift-off still has several disadvantages. For example, the release rate is slow owing to slow penetration of chemical etchant through the sacrificial layer (e.g., typically a few days to release a single 8-inch wafer). Second, etching residues tend to become surface contamination after release. Third, chemical lift-off has limited reusability owing to the chemical mechanical planarization (CMP) performed after release to recover the roughened substrate surface into an epi-ready surface. Fourth, it can be challenging to handle released epilayers in the chemical solution.

The optical lift-off technique usually uses a high-power laser to irradiate the back of the lattice-matched substrate (e.g., a transparent sapphire or SiC substrate) and selectively heat the device-substrate interface, causing decomposition of the interface and release of the device layer.

However, optical lift-off has its own limitations. First, because the molten device film/substrate interface can make the substrate rough, a reconditioning step is usually carried out before reuse, thereby reducing the reusability to less than five times. Second, local pressurization at the interface caused by high-power thermal irradiation can induce cracks or dislocations. Third, the laser scanning speed can be too slow to permit high-throughput.

Controlled spalling can have a higher throughput than optical lift-off. In this technique, high-stress films (also referred to as "stressors") are deposited on the epitaxial film, inducing fracture below the epilayers and resulting in the separation of active materials from the substrate. When sufficient tensile stress is applied to the interface, a $K_{II}$ shear mode can initiate a crack and a $K_I$ opening mode can allow the propagation of the crack parallel to the interface between the epilayer and the substrate. By controlling the internal stress and thickness of the stressor, strain energy sufficient to reach the critical $K_I$ can be provided, leading to fracture of the film/substrate interface. Because the exfoliation occurs via crack propagation, the spalling process can cause rapid release of films.

However, controlled spalling is not mature enough to be used for commercial manufacturing for at least the following reasons. First, because crack propagation generally occurs through cleavage planes that are not always aligned normal to the surface, the surface may need polishing for reuse. Second, a thick stressor is usually used to provide enough energy to separate strong covalent bonds, particularly when working with high Young's modulus materials like compound semiconductors. Third, the internal stress of the stressor may only be controlled in a narrow range, which constrains the achievable thickness of the resulting spalled film.

Accordingly, improved materials and methods are needed.

SUMMARY

Systems and methods for growth of silicon carbide over a layer comprising graphene and/or hexagonal boron nitride, and related articles, are generally described.

In some aspects, methods are provided. In some embodiments, a method comprises forming a silicon carbide (SiC) film over a layer comprising graphene and/or hexagonal boron nitride (hBN) that is over a substrate; wherein at least a portion of the formation of the SiC film occurs in the presence of a gaseous material comprising an inert gas.

Other advantages and novel features of the present invention will become apparent from the following detailed description of various non-limiting embodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures.

DETAILED DESCRIPTION

Figure 1A:
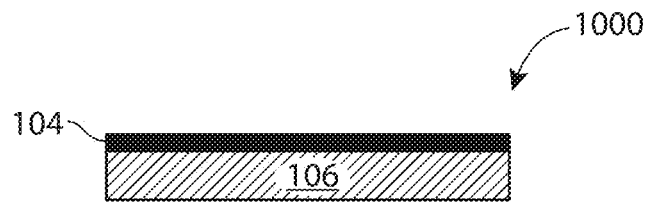
FIG. 1A is a schematic illustration of an exemplary article 1000 comprising a substrate 106 and a layer 104 comprising graphene and/or hexagonal boron nitride (hBN), according to one set of embodiments.

Systems and methods for growth of silicon carbide over a layer comprising graphene and/or hexagonal boron nitride, and related articles, are generally described.

In some aspects, methods are provided. In certain embodiments, a method comprises forming a silicon carbide (SiC) film over a layer comprising graphene and/or hexagonal boron nitride (hBN) that is over a substrate, wherein at least a portion of the formation of the SiC film occurs in the presence of a gaseous material comprising an inert gas. In certain embodiments, carrying out at least a portion of the formation of the silicon carbide film in the presence of an inert gas advantageously prevents or mitigates the etching of the layer (e.g., of the graphene and/or of the hBN) during the at least one portion of the formation of the silicon carbide film, such that the silicon carbide film is formed over the layer rather than directly on the substrate. In some such embodiments, the layer may advantageously facilitate separation (e.g., mechanical separation) of the silicon carbide film from the substrate after formation of the silicon carbide film. Separation of the silicon carbide film from the substrate may take place, in some embodiments, by first growing a stressor and/or attaching tape over at least a portion of (e.g., all of) an exposed surface of the silicon carbide film, and then mechanically separating the silicon carbide film from the substrate by a force applied to the stressor and/or tape to pull at least a portion of the stressor and/or tape away from the substrate. As used herein, the term "tape" refers to a film comprising an adhesive that adheres to silicon carbide and/or adheres to a stressor material (e.g., nickel). In certain embodiments, the separated silicon carbide film may then advantageously be transferred to a second substrate (e.g., comprising a semiconductor, e.g., silicon), e.g., for fabrication of a device comprising the silicon carbide film.

As described above, it may be desirable for methods (e.g., layer-transfer processes) to have at least substrate reusability, minimal need for post-release treatment, a fast release rate, and/or precise control of release interfaces. Conventional layer-transfer processes may exhibit some of the desired properties. For example, layer release may be much faster for mechanical lift-off than for chemical or optical lift-off, whereas the release location may be better controlled in chemical and optical lift-off. However, conventional layer-transfer methods may suffer from rough surface formation after layer release, thereby limiting substrate reusability. In fact, the process cost to refurbish a substrate surface in conventional layer-transfer methods typically exceeds the substrate cost, so practical applications in manufacturing can be challenging.

To address the shortcomings in conventional layer-transfer methods, certain systems and methods described herein employ a layer-transfer approach towards fabricating devices comprising a SiC film. In some embodiments, a method comprises forming a SiC film over a layer comprising graphene and/or hBN, which layer in turn is disposed over a substrate that, in some embodiments, is lattice-matched to the SiC film. In some embodiments, the method comprises depositing the layer comprising graphene and/or hBN directly on the substrate (e.g., a lattice-matched substrate). In some embodiments, the method comprises transferring the layer comprising graphene and/or hBN to the substrate (e.g., lattice-matched substrate) from another substrate. In some embodiments, the method comprises removing the formed SiC film from the substrate (e.g., lattice-matched substrate) via, for example, a stressor attached to the SiC film.

In certain embodiments, in a non-limiting layer-transfer method, a layer comprising graphene and/or hBN serves as a reusable platform for growing SiC films and also serves as a release layer that allows fast, precise, and repeatable release at the graphene surface. Compared to conventional methods, a layer-transfer method may have one or more of several advantages. First, because graphene and/or hBN are crystalline films, they may be generally suitable as a base for growing epitaxial over-layers. Second, weak interaction of graphene and/or hBN with other materials may substantially relax the lattice mismatching rule for epitaxial growth, facilitating the growth of SiC films with low defect densities. Third, an SiC film grown on a layer comprising graphene and/or hBN may be easily and precisely released from the substrate over which the layer is disposed, owing at least to weak van der Waals interactions of graphene and/or hBN, which may facilitate rapid mechanical release of SiC films grown over the layer without post-release reconditioning of the released surface. Fourth, robustness of graphene and/or hBN may facilitate reusability of a layer for multiple growth/release cycles.

Implementation of methods described herein may have a significant impact on both the scientific community and industry, at least because layer-transfer methods using layers comprising graphene and/or hBN have the potential to fabricate devices without the expensive millimeter-thick, single-crystalline wafers used in current semiconductor processing. Moreover, in certain embodiments, SiC films can be transferred from a layer comprising graphene and/or hBN, for additional flexible functions.

In some embodiments, a method comprises forming a silicon carbide (SiC) film over a layer comprising graphene and/or hexagonal born nitride (hBN) that is over a substrate. Embodiments of silicon carbide films, embodiments of layers, and embodiments of substrates are described in further detail elsewhere herein.

Terms that describe the relative spatial positions of components (e.g., "above," "below," "over," "under," etc.) are generally used herein for ease of description and understanding of the relative arrangement of components, for example, as shown in the accompanying figures. As would be understood by a person of ordinary skill in the art, however, claims reciting such terms are intended to encompass varying orientations of the articles comprising those components, as long as the components are positioned relative to each other in a manner consistent with the recitations in the claims. For example, features described as being "below" or "under" other features would, after the article is turned upside down, be oriented "above" or "on top of" the other features. As another example, features described as being "below" or "under" other features would, after the article is rotated 90 degrees counter-clockwise, be oriented "to the right of" the other features.

When a structure (e.g., layer and/or device) is referred to as being "on," "over," or "overlying" another structure (e.g., layer or substrate), it can be directly on the structure, or an intervening structure (e.g., a solid material, air gap, etc.) also may be present. A structure that is "directly on" or "directly over" or "in direct contact with" another structure, or placed "directly onto" another structure, means that no intervening structure is present. It should also be understood that when a structure is referred to as being "on" or "over" another structure, it may cover the entire structure, or a portion of the structure.

In some embodiments, at least a portion of the formation of the SiC film occurs in the presence of a gaseous material comprising an inert gas. In some embodiments, the inert gas comprises (e.g., in an amount of at least 10 at %, 25 at %, 50 at %, 75 at %, 90 at %, 99 at %, or more) Argon (Ar), Helium (He), and/or nitrogen ($N_2$). As used herein, the term "inert gas" refers to a gas or vapor comprising atoms or molecules that do not chemically react with and/or etch the graphene and/or hexagonal boron nitride. In certain embodiments, this utilization of inert gas during at least a portion of the formation of the silicon carbide film decreases or prevents etching of a layer over the substrate, such that the at least one portion of the silicon carbide film is formed over the layer. In some embodiments, the inert gas consists essentially of Argon, Helium, and/or nitrogen ($N_2$). In certain embodiments, the inert gas comprises (e.g., in an amount of at least 10 at %, 25 at %, 50 at %, 75 at %, 90 at %, or 99 at %) or consists essentially of Argon (Ar).

In certain embodiments, at least a portion of the duration of the formation of the silicon carbide film occurs in the presence of a gaseous material comprising an inert gas. In some embodiments, the gaseous material comprising the inert gas is present for at least 3 minutes, at least 5 minutes, or at least 10 minutes of the formation of the silicon carbide film. In some embodiments, the gaseous material comprising the inert gas is present for at most 90 minutes, at most 60 minutes, at most 40 minutes, or at most 20 minutes. Combinations of the above-referenced ranges are also possible (e.g., between or equal to 3 minutes and 90 minutes, between or equal to 5 minutes and 60 minutes, between or equal to 10 minutes and 20 minutes). Other ranges are also possible. In certain embodiments, the gaseous material comprising the inert gas is present for 3 minutes. In certain embodiments, the gaseous material comprising the inert gas is present for 10 minutes. In certain embodiments, the gaseous material comprising the inert gas is present for 20 minutes. In certain embodiments, the gaseous material comprising the inert gas is present for 60 minutes.

As used herein, the formation of the silicon carbide film involves the introduction of or presence of precursor gases (e.g., silane and propane) to silicon carbide in an environment of a layer comprising graphene and/or hBN over a substrate.

Methods described herein may involve forming a silicon carbide film over a structure, comprising a layer over a substrate, having a certain architecture. For example, in some embodiments, the layer comprising the graphene and/or hexagonal boron nitride is one of a plurality of layers, and forming the SiC film comprises forming the SiC film over (e.g., directly on) the plurality of layers comprising graphene and/or hexagonal boron nitride. In some embodiments, the layer comprising the graphene and/or hexagonal boron nitride is the only layer between the SiC film and the substrate. In some embodiments, a single layer of graphene is used. In certain embodiments, a single layer of hexagonal boron nitride is used.

In certain embodiments, a method comprises growing a silicon carbide film over a structure, comprising a layer over a substrate, using a material of the structure as a seed for growth of the silicon carbide film. For example, in some embodiments, forming the SiC film on the layer comprises using the substrate as a seed for the SiC film. In some embodiments, forming the SiC film on the layer comprises using the layer comprising the graphene and/or hexagonal boron nitride as a seed for the SiC film. In some embodiments, forming the SiC film on the layer comprises using a combination of the substrate and the layer comprising the graphene and/or hexagonal boron nitride as a seed for the SiC film.

In some embodiments, the substrate is made, in whole or in part, of a compound semiconductor. For example, in certain embodiments, the substrate is made, in whole or in part, of a III-Nitride, which comprises a group III element in the periodic table (e.g., aluminum, gallium) and nitrogen. Non-limiting examples of substrate materials include gallium nitride (GaN), aluminum nitride (AlN), and aluminum gallium nitride ($Al_xGa_{1-x}N$). In certain embodiments, the substrate comprises silicon carbide. For example, in some embodiments, a surface of the substrate comprises silicon carbide. In certain embodiments, the surface of the substrate over which the layer is positioned during growth is an SiC surface.

In some embodiments, a method comprises forming a layer comprising graphene and/or hexagonal boron nitride on a substrate. In some embodiments, forming the layer on the substrate comprises growing the layer on the substrate. In some embodiments, the substrate is a first substrate, and forming the layer on the first substrate comprises transferring the layer from a second substrate to the first substrate. In some embodiments, the layer is directly on the substrate.

In certain embodiments, a method comprises forming a silicon carbide film on a layer comprising graphene and/or hexagonal boron nitride that is on a substrate after forming the layer on the substrate.

In some embodiments, the method comprises ramping, to a growth temperature, an environment comprising a gaseous material comprising an inert gas, wherein the environment is the environment of a layer comprising graphene and/or hBN over a substrate. In certain embodiments, the ramping occurs before formation of the silicon carbide film. In some embodiments, the method comprises ramping, to a growth temperature, an environment comprising a gaseous material comprising an inert gas, wherein the environment is the environment of a layer comprising graphene and/or hBN over a substrate, with a flow of the gaseous material at a high enough flow rate to decrease, suppress, or eliminate growth of graphene or additional graphene during the ramp. In some embodiments, the flow rate of the gaseous material comprising the inert gas during the ramp is greater than or equal to 10 standard liters per minute (slm), greater than or equal to 20 slm, greater than or equal to 30 slm, or greater than or equal to 40 slm. In some embodiments, the flow rate of the gaseous material comprising the inert gas during the ramp is less than or equal to 80 slm, less than or equal to 70 slm, less than or equal to 60 slm, or less than or equal to 50 slm.

Combinations of the above-referenced ranges are also possible (e.g., between or equal to 10 slm and 80 slm, between or equal to 20 slm and 70 slm, between or equal to 30 slm and 60 slm). Other ranges are also possible. For example, in certain embodiments, the flow rate of the gaseous material comprising the inert gas during the ramp is 50 slm. In certain embodiments, the flow rate of the gaseous material comprising the inert gas during the ramp is 30 slm.

In some embodiments, at least a portion of the formation of the silicon carbide film occurs at a particular growth temperature of the environment of a layer comprising graphene and/or hBN over a substrate. In some embodiments, at least a portion of the formation of the silicon carbide film occurs at a temperature of the environment of at least 1350° C., at least 1400° C., or at least 1500° C. In some embodiments, at least a portion of the formation of the silicon carbide film occurs at a temperature of the environment of at most 1800° C., at most 1620° C., or at most 1540° C. Combinations of the above-referenced ranges are also possible (e.g., between or equal to 1350° C. and 1800° C., between or equal to 1350° C. and 1500° C., between or equal to 1500° C. and 1800° C., between or equal to 1400° C. and 1540° C.). Other ranges are also possible. In certain embodiments, at least a portion of the formation of the silicon carbide film occurs at a temperature of the environment of 1620° C. In certain embodiments, at least a portion of the formation of the silicon carbide film occurs at a temperature of the environment of 1400° C. In certain embodiments, at least a portion of the formation of the silicon carbide film occurs at a temperature of the environment of 1540° C.

In some embodiments, a method comprises separating a SiC film from a substrate. In certain embodiments, during the separating, the layer comprising the graphene and/or hexagonal boron nitride is used as a release layer. In some embodiments, separating the SiC film and the substrate comprises exfoliating the SiC film. In some embodiments, the SiC film is a first SiC film, and the method further comprises forming a second SiC film on the substrate after the first SiC film and the substrate have been separated.

In certain embodiments, a method comprises separating a silicon carbide film from a substrate after forming a silicon carbide film on a layer comprising graphene and/or hexagonal boron nitride that is on a substrate. In certain embodiments, the method comprises forming the silicon carbide film on the layer after forming the layer on the substrate.

SiC films herein generally comprise at least some crystallinity. For example, in some embodiments, the silicon carbide film is crystalline. In certain embodiments, the SiC film is single-crystalline. In some embodiments, the SiC film comprises more than one polytype. For example, in some embodiments, the SiC film comprises two polytypes. In certain embodiments, the SiC film is polycrystalline.

In some embodiments, a film (e.g., SiC film) is a layer of material ranging from 0.1 nm to 1000 μm in thickness.

The layers between the substrate and the SiC described herein generally comprise graphene and/or hBN. For example, in some embodiments, the layer consists essentially of graphene and/or hBN. In certain embodiments, the layer is a graphene layer. In certain embodiments, the layer is a hBN layer.

The layers between the substrate and the SiC described herein generally comprise at least some crystallinity. For example, in some embodiments, the layer is a polycrystalline layer. In some embodiments, the layer is a single-crystalline layer.

In certain embodiments, the substrate comprises a semiconductor. For example, in some embodiments, the substrate is a semiconductor substrate. In some embodiments, the substrate is made, in whole or in part, of SiC.

In some embodiments, the substrate is made, in whole or in part, of SiC having a certain offcut angle. In some embodiments, the substrate is made, in whole or in part, of SiC having an offcut angle of greater than or equal to 0°, greater than or equal to 2°, or greater than or equal to 4°. In some embodiments, the substrate is made, in whole or in part, of SiC having an offcut angle of less than or equal to 10°, less than or equal to 8°, or less than or equal to 6°. Combinations of the above-referenced ranges are also possible (e.g., between or equal to 0° and 10°, between or equal to 0° and 8°, between or equal to 0° and 4°). For example, in some embodiments, the substrate is made, in whole or in part, of 4° off-axis SiC. As used herein, 4° off-axis silicon carbide corresponds to a 4° offcut angle. In some embodiments, the substrate is made, in whole or in part, of 2° off-axis SiC. As used herein, 2° off-axis silicon carbide corresponds to a 2° offcut angle. In some embodiments, the substrate is made, in whole or in part, of on-axis SiC. As used herein, on-axis silicon carbide corresponds to a 0° offcut angle.

Substrates herein generally comprise at least some crystallinity. For example, in some embodiments, the substrate is crystalline. In certain embodiments, the substrate is single-crystalline.

Turning now to the figures, several non-limiting embodiments are described in further detail. It should be understood that the current disclosure is not limited to only those specific embodiments described herein. Instead, the various disclosed components, features, and methods may be arranged in any suitable combination as the disclosure is not so limited.

FIG. 1A is a schematic illustration of an exemplary article 1000 comprising a substrate 106 and a layer 104 comprising graphene and/or hexagonal boron nitride, according to one set of embodiments. In certain embodiments, a method comprises forming layer 104 on substrate 106. In other embodiments, a method comprises transferring layer 104 to substrate 106.

Figure 1B:
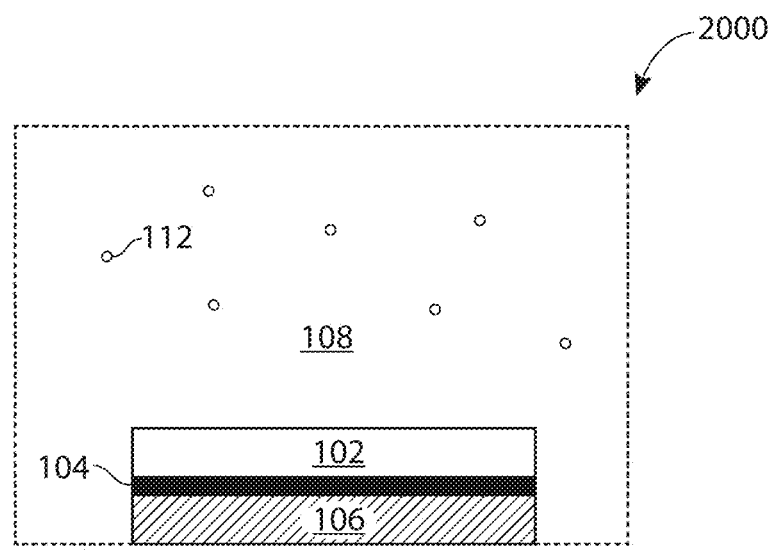
FIG. 1B is a schematic illustration of an exemplary system 2000 for growth of a silicon carbide (SiC) film 102 over substrate 106, according to one set of embodiments.

FIG. 1B is a schematic illustration of an exemplary system 2000 for growth of a silicon carbide (SiC) film 102 over substrate 106, according to one set of embodiments. In certain embodiments, a method comprises forming silicon carbide film 102 over layer 104 comprising graphene and/or hexagonal boron nitride that is over substrate 106, wherein at least a portion of the formation of silicon carbide film 102 occurs in the presence of a gaseous material 108 comprising an inert gas comprising species 112, wherein species 112 is an atom or molecule of an inert gas (e.g., helium, argon, nitrogen ($N_2$)). In certain embodiments, during the at least one portion of the formation of silicon carbide film 102, gaseous material 108 further comprises gaseous precursors to silicon carbide. In certain embodiments, substrate 106 comprises silicon carbide.

Figure 1C:
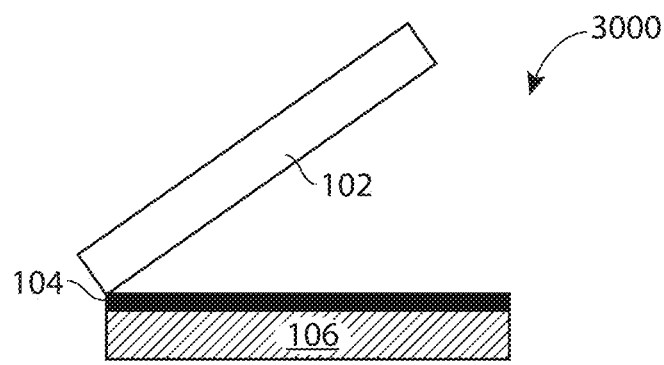
FIG. 1C is a schematic illustration of an exemplary system 3000 depicting separation of a silicon carbide film 102 from substrate 106, according to one set of embodiments.

FIG. 1C is a schematic illustration of an exemplary system 3000 depicting separation of silicon carbide film 102 from substrate 106, according to one set of embodiments. In certain embodiments, silicon carbide film 102 was formed by a method described with respect to FIG. 1B. In certain embodiments, a method comprises mechanically separating silicon carbide film 102 from substrate 106. In some embodiments, mechanical separation of silicon carbide film 102 from substrate 106 is accomplished by first growing a stressor (not shown) and/or attaching tape (not shown) to at least a portion of (e.g., all of) an exposed surface of silicon carbide film 102 and then applying a force, directed away from substrate 106, to at least a portion of the stressor and/or tape.

Figure 1D:
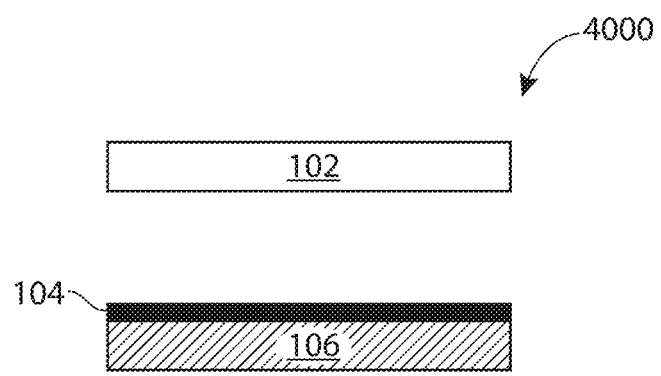
FIG. 1D is a schematic illustration of an exemplary system 4000 comprising a free-standing silicon carbide film 102 removed from a substrate 106 (e.g., by separation as in FIG. 1C), according to one set of embodiments.

FIG. 1D is a schematic illustration of an exemplary system 4000 comprising a free-standing silicon carbide film 102 removed from substrate 106 (e.g., by separation as in FIG. 1C), according to one set of embodiments. Free-standing silicon carbide film 102, in some embodiments, may be disposed under a stressor and/or tape. In certain embodiments, free-standing silicon carbide film 102 may be transferred to another substrate, e.g., towards fabrication of a device comprising silicon carbide film 102.

Figure 11A:
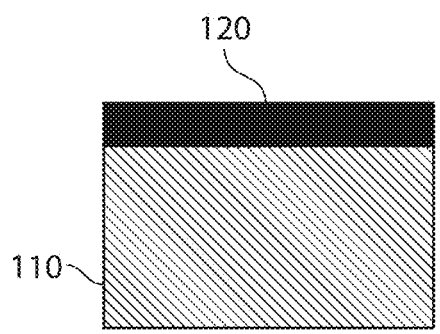
FIG. 11A-FIG. 11D illustrate a method 100 of fabricating a semiconductor device using a graphene-based and/or hBN-based layer transfer process, according to one set of embodiments.
Figure 11B:
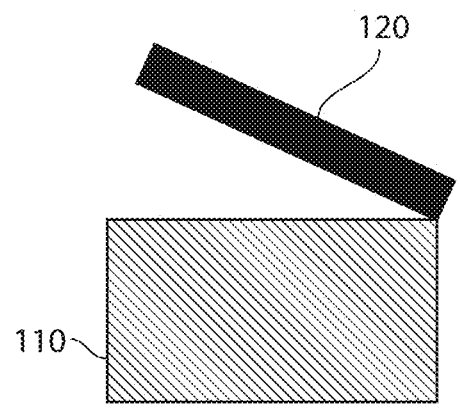
Figure 11C:
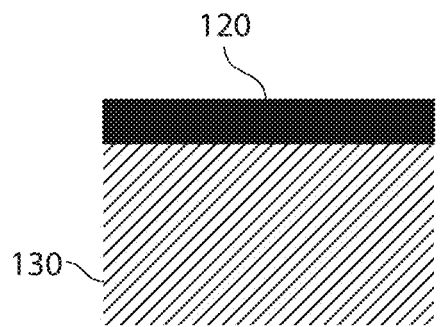
Figure 11D:
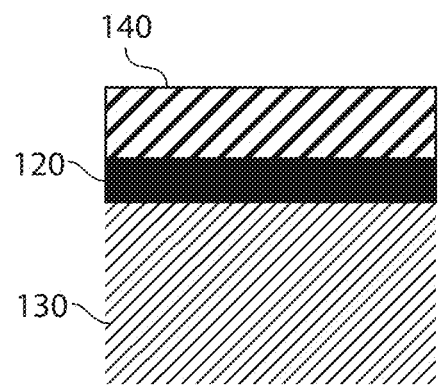

FIG. 11A-FIG. 11D illustrate a method 100 of fabricating a SiC film using graphene and/or hBN as a platform, according to some embodiments. As shown in FIG. 11A, a layer 120 comprising graphene and/or hBN may be fabricated on a first substrate 110, such as a Si substrate, SiC substrate, or copper foil. In certain embodiments, layer 120 consists essentially of graphene and/or hBN. Fabricated layer 120 may then be removed from first substrate 110 as shown in FIG. 11B. Removed layer 120 may then be disposed on a second substrate 130, such as a SiC substrate, as shown in FIG. 11C. FIG. 11D shows that a SiC film 140 (e.g., a single crystalline SiC film, advantageous for high electrical and optical device performance) may then be fabricated on layer 120. An SiC film (e.g., 140) may also be referred to as a device layer or a functional layer in this application.

Layer 120 may be fabricated on first substrate 110 via various methods. In one example, layer 120 may include an epitaxial graphene with a single-crystalline orientation and/or an epitaxial hBN with a single-crystalline orientation and substrate 110 may include (0001) 4H—SiC (e.g., with a silicon surface) and/or (0001) 6H—SiC (e.g., with a silicon surface). The fabrication of layer 120 may include multistep annealing steps. A first annealing step may be performed in $H_2$ gas for surface etching and vicinalization, and a second annealing step may be performed in Ar for graphitization at high temperature (e.g., about 1,575° C.).

In another example, layer 120 may be grown on first substrate 110 via a chemical vapor deposition (CVD) process. Substrate 110 may include a nickel substrate or a copper substrate. Alternatively, substrate 110 may include an insulating substrate of $SiO_2$, $HfO_2$, $Al_2O_3$, $Si_3N_4$, and/or practically any other high temperature compatible planar material by CVD.

In yet another example, first substrate 110 may be any substrate that can hold layer 120 and the fabrication may include a mechanical exfoliation process. In this example, first substrate 110 may function as a temporary holder for layer 120.

Various methods may also be used to transfer layer 120 from first substrate 110 to second substrate 130. In one example, a carrier film may be attached to layer 120. The carrier film may include a thick film of Poly(methyl methacrylate) (PMMA) or a thermal release tape and the attachment may be achieved via a spin-coating process. In some embodiments, after the combination of the carrier film and layer 120 disposed on second substrate 130, the carrier film may be dissolved (e.g., in acetone) for further fabrication of SiC film 140 on layer 120.

In another example, a stamp layer including an elastomeric material such as polydimethylsiloxane (PDMS) may be attached to layer 120 and first substrate 110 may be etched away, leaving the combination of the stamp layer and layer 120. In some embodiments, after the stamp layer and layer 120 are placed on second substrate 130, the stamp layer may be removed by mechanical detachment, producing a clean surface of layer 120 for further processing.

In yet another example, a self-release transfer method may be used to transfer layer 120 to second substrate 130. In this method, a self-release layer may first be spun-cast over layer 120. An elastomeric stamp may then be placed in conformal contact with the self-release layer. First substrate 110 may be etched away to leave the combination of the stamp layer, the self-release layer, and layer 120. In some embodiments, after this combination is placed on second substrate 130, the stamp layer may be removed mechanically and the self-release layer may be dissolved under mild conditions in a suitable solvent. The release layer may include polystyrene (PS), poly(isobutylene) (PIB), and/or Teflon AF (poly[4,5-difluoro-2,2-bis(trifluoromethyl)-1,3-dioxole-co-tetrafluoroethylene]).

In one example, the lattice of second substrate 130 is matched to SiC film 140, in which case second substrate 130 functions as the seed for the growth of SiC film 140 if layer 120 is thin enough (e.g., if layer 120 is one layer thick). Sandwiching layer 120 between second substrate 130 and SiC film 140 may facilitate quick and damage-free release and transfer of SiC film 140.

In another example, layer 120 may be thick enough (e.g., several layers thick) to function as a seed to grow SiC film 140, in which case SiC film 140 may be lattice-matched to layer 120. This example may also facilitate repeated use of second substrate 130. In yet another example, second substrate 130 together with layer 120 may function as the seed to grow SiC film 140.

Using layer 120 as the seed to fabricate SiC film 140 may also increase the tolerance over mismatch of lattice constant between the SiC film layer 120.

Without wishing to be bound by any particular theory or mode of operation, surfaces of graphene and/or hBN typically have no dangling bonds and interact with material above them via weak van der Waals like forces. Due to the weak interaction, a SiC film may grow from the beginning with its own lattice constant forming an interface with a small amount of defects. This kind of growth may be referred to as Van Der Waals Epitaxy (VDWE). The lattice matching condition may be drastically relaxed for VDWE, allowing a large variety of different heterostructures even for highly lattice mismatched systems.

In practice, the lattice mismatch may be about 0% to about 70% (e.g., about 0%, about 10%, about 20%, about 30%, about 40%, about 50%, about 60%, and about 70%, including any values and sub ranges in between).

In one example, SiC film 140 includes a 2D material system. In another example, SiC film 140 includes a 3D material system. The flexibility to fabricate both 2D and 3D material systems allows fabrication of a wide range of optical, optoelectronic, and photonic devices known in the art.

The fabrication of SiC film 140 may be carried out using semiconductor fabrication technique known in the art. For example, low-pressure Chemical Vapor Deposition (CVD) may be used to grow SiC film 140 on layer 120, which in turn is disposed on second substrate 130 (e.g., a SiC substrate). In this example, layer 120 and second substrate 130 may be baked (e.g., under $H_2$ for >15 min at >1,100° C.) to clean the surface. Then the deposition of SiC film 140 may be performed.

Figure 12A:
FIG. 12A-FIG. 12F illustrate a method 300 of graphene-based and/or hBN-based layer fabrication and transfer using a stressor layer and tape, according to one set of embodiments.

FIG. 12A-FIG. 12F illustrate a method 300 of layer transfer. FIG. 12A shows that a layer 320 comprising graphene and/or hBN is formed or disposed on a donor wafer 310, which may be a single-crystalline wafer. For example, layer 320 may include epitaxial graphene grown on donor wafer 310. Alternatively, layer 320 may be exfoliated and transferred to donor wafer 310 from another wafer (not shown). In yet another example, any of the transfer techniques described above with reference to FIG. 11A-FIG. 11D may be used here to prepare layer 320 disposed on donor wafer 310.

Figure 12B:
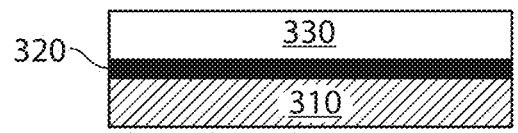

FIG. 12B shows that a SiC film 330 may be epitaxially grown on layer 320. SiC film 330 may include an electronic layer, a photonic layer, or any other functional device layer. Methods to fabricate SiC film 330 may include any methods and techniques described above with respect to FIG. 11A-FIG. 11D.

Figure 12C:
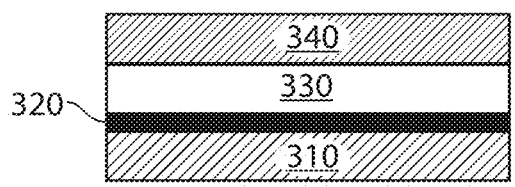

FIG. 12C shows that a stressor 340 may be disposed on SiC film 330. For example, stressor 340 may include a high-stress metal film such as a Ni film. In one example, the Ni stressor may be deposited in an evaporator at a vacuum level of $1 \times 10^{-5}$ Torr.

Figure 12D:
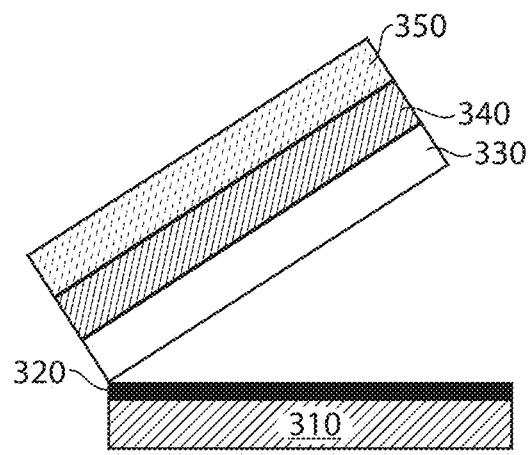

FIG. 12D shows that a tape layer 350 may be disposed on stressor 340 for handling stressor 340. Using tape 350 and stressor 340 may mechanically exfoliate SiC film 330 from layer 320 at a fast release rate by applying high strain energy to the interface between SiC film 330 and layer 320. The release rate may be fast at least due to the weak van der Waals bonding between graphene and other materials such as SiC film 330.

Figure 12E:
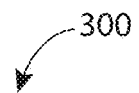
Figure 12E:
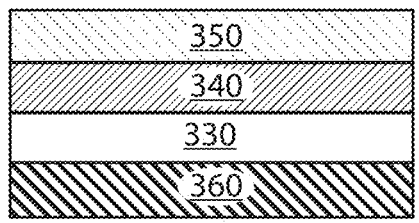
Figure 12F:

In FIG. 12E, released SiC film 330, together with stressor 340 and tape layer 350 may be disposed on a host wafer 360. In FIG. 12F, tape 340 and stressor 340 may be removed, leaving SiC film 330 for further processing such as forming more sophisticated devices or depositing additional materials on SiC film 330. In one example, tape layer 350 and stressor 340 may be etched away by a $FeCl_3$-based solution.

In the method 300, after the release of SiC film 330 shown in FIG. 12D, remaining donor wafer 310 and layer 320 may be reused for a next cycle of SiC film fabrication. Alternatively, layer 320 may also be released. In this case, a new layer may be disposed on donor wafer 310 before next cycle of SiC film fabrication. In either case, layer 320 may protect donor wafer 310 from damage, thereby allowing multiple uses and reducing cost.

In contrast, conventional processes usually include chemical-mechanical planarization (CMP) after release to recondition the wafer surface. CMP may consume relatively thick materials, and repeated CMPs may increase the chance of breaking a wafer. Graphene-based and/or hBN-based layer transfer may increase reusability because layer transfer may involve an atomically smooth release surface. In layer transfer, layer release may occur precisely at the interface between SiC film 330 and layer 320 at least because graphene's and/or hBN's weak van der Waals force would not involve strong bonding to adjacent materials. This may facilitate layer 320 to be reused for multiple growth/exfoliation cycles without the need for a polishing step and without damaging the graphene, due to its mechanical robustness. In addition, layer transfer may ensure a fast release rate. Because SiC film 330 may be mechanically released from a weakly bound layer 320 surface, the layer release rate in layer transfer may be high.

Furthermore, in some embodiments, by having a highly strained freestanding SiC film 330 after release as shown in FIG. 12D, devices comprising SiC film 330 may have higher electron or hole mobility. An optoelectronic device comprising SiC film 330 may also have an enhanced optical response.

For mechanical release of SiC film 330 from layer 320, it may be desirable for the material of stressor 340 to provide enough strain energy to the SiC film 330/layer 320 interfaces to promote damage-free exfoliation/transfer. One concern for the mechanical release process may be the bending of SiC film 330 during exfoliation and self-exfoliation during deposition of stressor 340. If the radius of curvature is reduced during exfoliation, strain energy may increase in SiC film 330. In some embodiments, when the strain energy reaches a critical point, cracks may form. Also, if strain energy in the stressor exceeds the SiC film 330/layer 320 interface energy, SiC film 330 may be delaminated during stressor deposition. To address this concern, the transfer of SiC film 330 on layers 320 may be performed using feedback loop control.

International Publication Number WO 2017/044577, published Mar. 16, 2017, filed Sep. 8, 2016, and entitled "SYSTEMS AND METHODS FOR GRAPHENE BASED LAYER TRANSFER," is incorporated herein by reference in its entirety.

U.S. Provisional Patent Application Ser. No. 62/688,472, filed Jun. 22, 2018, and entitled "REDUCTION OF BASAL PLANE DISLOCATIONS IN EPITAXIAL SIC USING AN IN-SITU ETCH PROCESS," is incorporated herein by reference in its entirety.

The following examples are intended to illustrate certain embodiments described herein, including certain aspects of the present invention, but do not exemplify the full scope of the invention.

Example 1

This example generally describes the growth of SiC films, e.g., by remote epitaxy.

A purpose of growing SiC films by remote epitaxy was to transfer epitaxially grown SiC films from a (graphene layer)/SiC substrate to a desired substrate. Growing SiC films by remote epitaxy may facilitate making electronic heterostructures which would otherwise be impractical to grow. Growing SiC films by remote epitaxy may also facilitate creating devices at reduced costs by transferring to less expensive substrates or transferring to a material that may provide properties advantageous for a specific device. For example, a SiC film grown by remote epitaxy may be used to create a photonic crystal cavity for quantum sciences, e.g., by transferring a SiC film grown by remote epitaxy to a $SiO_2/Si$ substrate, resulting in a more easily processed cavity, at least due to working with Si instead of SiC as the substrate. Growing SiC films by remote epitaxy may also facilitate processing of the material compared to SiC processing. One may also use a SiC film grown by remote epitaxy to make power devices at lower cost to the consumer at least because the active region of the device may be still be SiC while the substrate may be Si for example, potentially making a significant impact on cost reduction due at least to reduced cost of the substrate. In addition to the ability to remove and/or transfer SiC films grown by remote epitaxy, a SiC film that is grown by remote epitaxy may also have a lower dislocation density and be of higher quality than the substrate, at least because the dislocations may not propagate as readily through a graphene layer (or hexagonal born nitride (hBN) layer) into the SiC film grown by remote epitaxy. Additionally, it may be difficult to grow a SiC film over an on-axis substrate. Using a graphene layer between a SiC substrate and a SiC film grown by remote epitaxy improved the surface morphology, relative to a silicon carbide film grown directly on an on-axis silicon carbide substrate, and resulted in a single crystal SiC film.

Growth of a SiC film, not by remote epitaxy, took place by first flowing a carrier gas, typically $H_2$, and ramping the temperature to a growth temperature. A typical process began by flowing 80 slm $H_2$ over a substrate with a pressure at 100 mbar. Measurement in standard liters per minute (slm) assumed standard temperature and pressure (60° F. (about 15.56° C.) and 1 atm). Then, the temperature (T) was ramped to the desired growth T (e.g., 1620° C.). Once the growth temperature was reached, the temperature, pressure, and flow rate(s) were stabilized for 5 min to allow any polishing damage or contaminants to be etched away from the substrate, which damage or contaminants may have been on the surface of the substrate, to prepare the surface for growth. This is a reason $H_2$ was typically the carrier gas. After this time, precursors were introduced where silane was the silicon (Si) source and propane was the carbon (C) source. The silane was introduced anywhere from 300 sccm to 2000 sccm with a C/Si ratio of 1.5. Measurement in standard cubic centimeters per minute (sccm) assumed standard temperature and pressure (60° F. (about 15.56° C.) and 1 atm). Here, $H_2$ was the carrier gas, e.g., to facilitate the propane to crack into the necessary elements for growth. The flows, T, and pressure (P) were maintained during growth for a desired amount of time. After growth, the precursors were turned off and the sample was cooled in $H_2$. Again, one reason to have $H_2$ flowing during the ramp was to prepare the surface of the substrate for growth.

To attempt to grow SiC by remote epitaxy, a SiC substrate first went through Si sublimation to form a graphene layer. A SiC film was grown on pseudo graphene that had been exfoliated with Ni metal to remove the top layer of graphene and leave the 6√3×6√3 reconstructed SiC. However, as one can grow directly on the graphene layer, growing on the graphene layer was preferred because this additional step (when using the pseudo graphene) of exfoliating the graphene layer to leave the 6√3×6√3 reconstructed SiC was not needed when growing directly on the graphene layer. Once the graphene layer was grown, growth of a SiC layer was performed.

Both ramping in $H_2$ and ramping in Ar were carried out.

When samples were ramped and grown in a $H_2$ carrier gas, exfoliation yield was 0%, which was not desirable. When ramping in $H_2$ to the growth temperature for SiC growth, which was a standard way to grow SiC on a SiC substrate, the morphology was advantageously smooth. Smooth silicon carbide films may facilitate patterning (e.g., patterning of surface features) on the silicon carbide film after exfoliation and/or transfer, e.g., towards forming devices. However, there were problems including difficulty removing the grown SiC film, at least because the graphene had been etched in the $H_2$, thus making remote epitaxy impractical. This etching resulted in a 0% yield in exfoliation of SiC films grown with the ramping in $H_2$. An example of surface morphology using a growth process similar to the standard SiC growth with a ramp in $H_2$ is shown in FIG. 2.

Figure 2A:
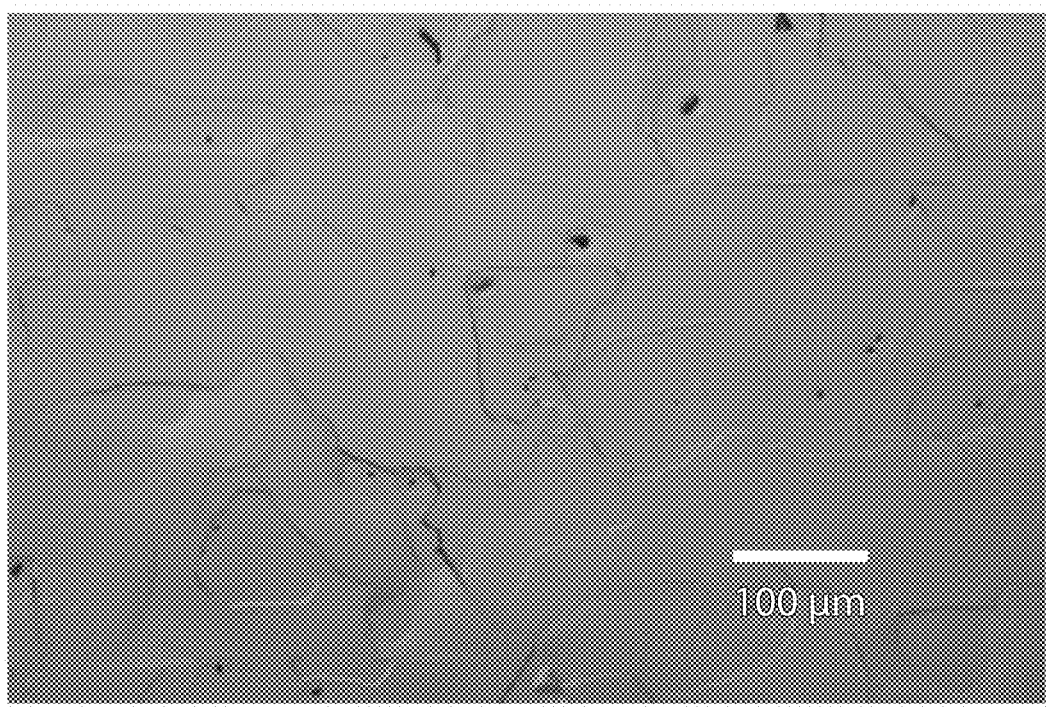
FIG. 2A is a Nomarski micrograph of a SiC film grown on what was originally (graphene layer)/SiC, with a ramping to growth temperature conducted in hydrogen ($H_2$) over an on-axis substrate, according to one set of embodiments.
Figure 2B:
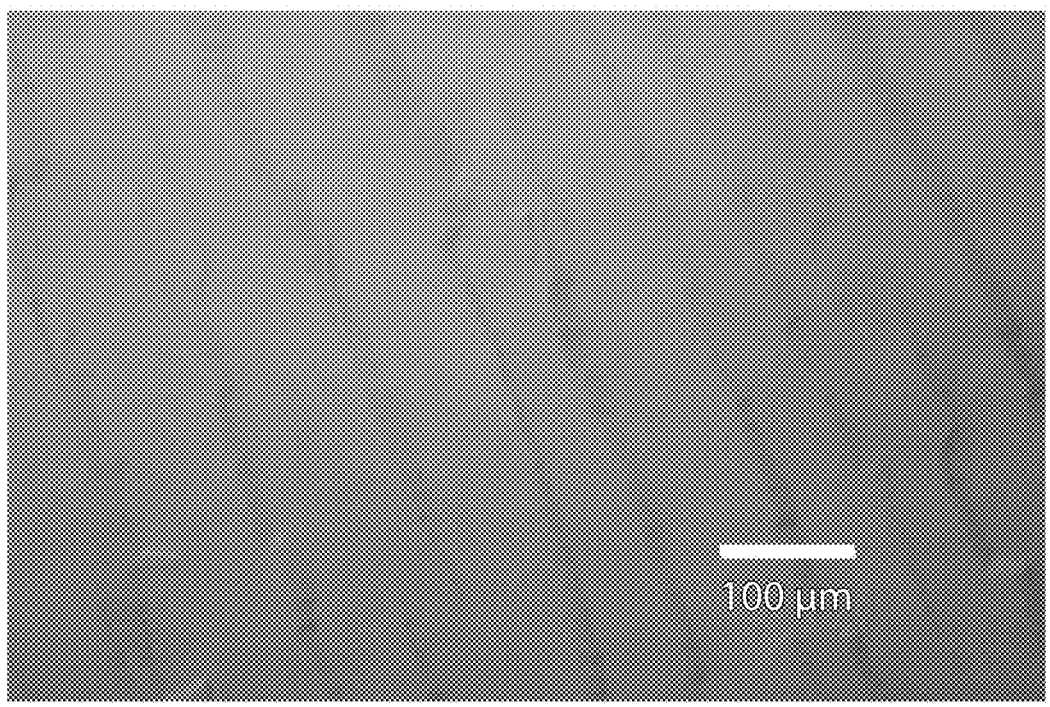
FIG. 2B is a Nomarski micrograph of a SiC film grown on what was originally (graphene layer)/SiC, with a ramping to growth temperature conducted in $H_2$ over a 4° off-axis substrate, according to one set of embodiments.

FIG. 2 shows Nomarski micrographs of SiC films grown on what was originally (graphene layer)/SiC, with a ramping to growth temperature conducted in $H_2$ (FIG. 2A) over an on-axis substrate and (FIG. 2B) over a 4° off-axis substrate. Exfoliation did not take place because the graphene was etched away during the ramp to growth temperature. FIG. 2A shows the growth over an on-axis substrate (wafer) while FIG. 2B is for growth over 4° off-axis (being c-oriented with angles cut off-axis toward the [11-20] direction) substrate. The morphology was improved for a SiC film grown over an off-cut substrate (e.g., FIG. 2B) compared to a SiC film grown over an on-axis substrate (e.g., FIG. 2A). Without wishing to be bound by theory, the on-axis grown SiC film (e.g., FIG. 2A) had grain boundaries likely due to island growth, but the off-axis grown SiC film (e.g., FIG. 2B) likely grew by step flow growth.

To mitigate the etching of graphene or prevent this etching from happening, ramping in Argon (Ar) was carried out. Additionally, the standard flow rate (5 slm) of Ar during the ramp to growth temperature for SiC film growth was not used as the standard flow rate could otherwise have potentially grown additional graphene or reduced the quality of the graphene layer. Instead, the flow during the ramp to growth temperature was increased 50 slm to prevent further graphene growth.

Figure 3A:
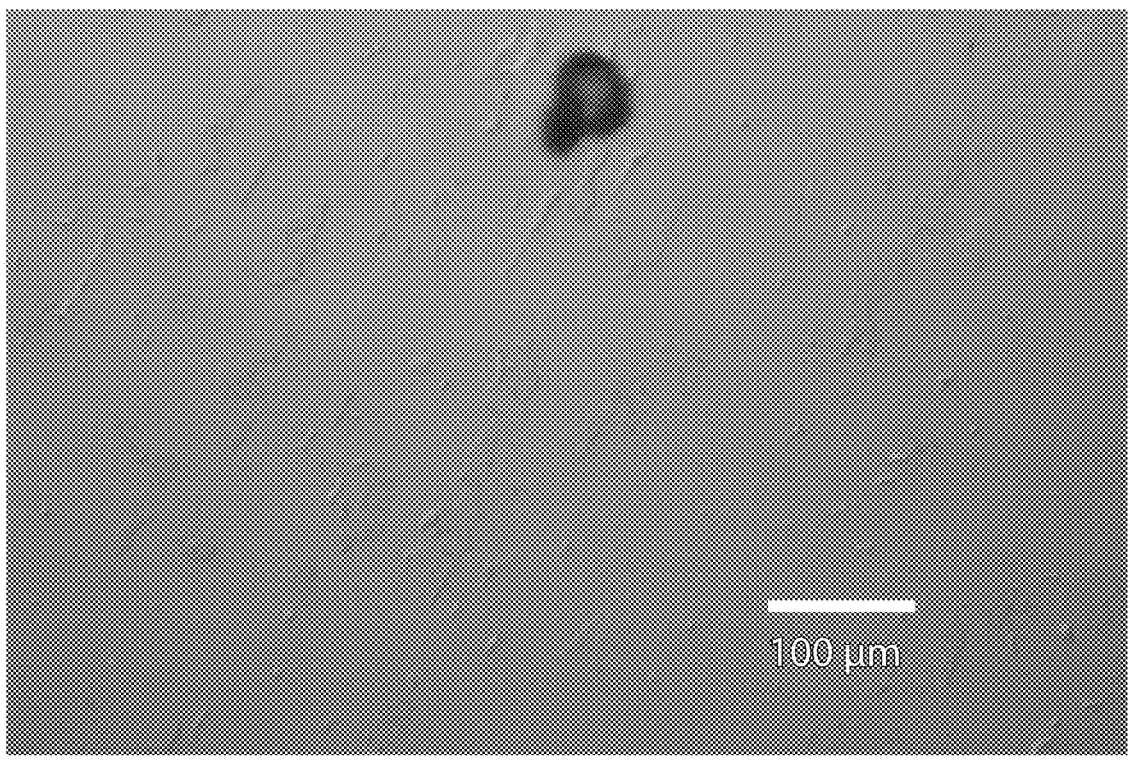
FIG. 3A is a Nomarski micrograph of a SiC film grown by remote epitaxy over an on-axis SiC substrate, with a graphene layer in between the substrate and the growing film, with the SiC film grown for 4 min, according to one set of embodiments.
Figure 3B:
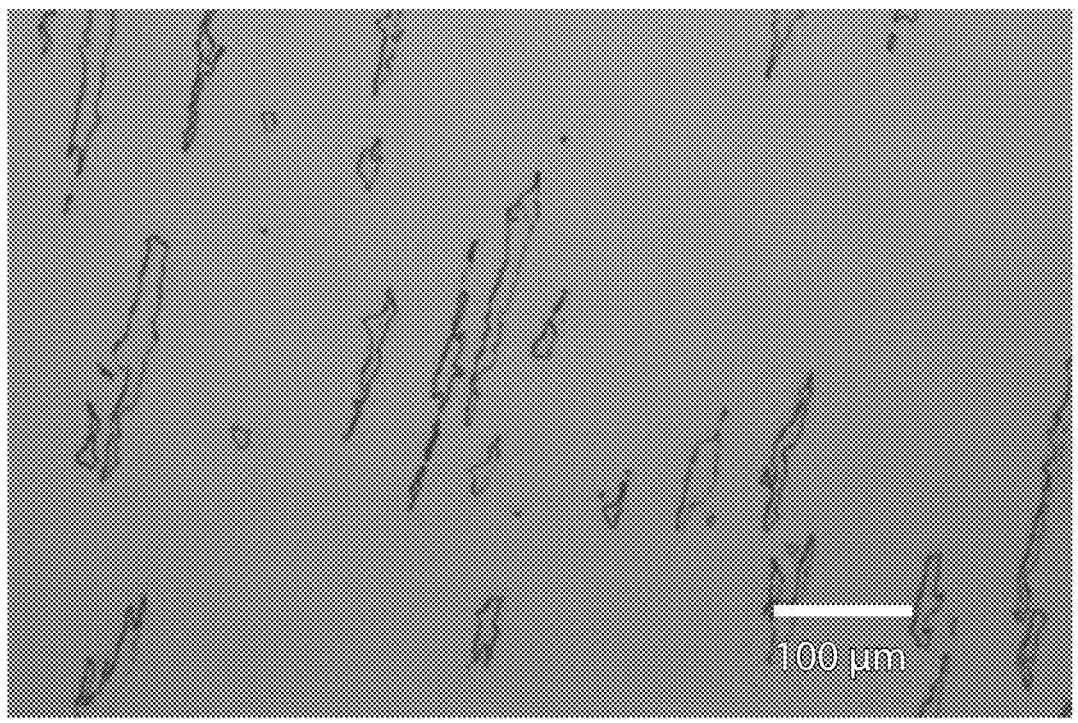
FIG. 3B is a Nomarski micrograph of a SiC film grown by remote epitaxy over an on-axis SiC substrate, with a graphene layer in between the substrate and the growing film, with the SiC film grown for 1 hr, according to one set of embodiments.

When the samples were ramped and grown in Ar and then switched to $H_2$ carrier gas after a short growth duration (between or equal to 3 minutes (min) and 10 min), exfoliation yield was increased to between or equal to 40% and 50%. When ramping to growth temperature took place in a higher flow of Ar than the growth of the graphene layer, SiC film morphology typically looked similar to FIG. 3A and FIG. 3B. Growth conditions were the same for both runs, results of which are depicted in FIG. 3. FIG. 3 shows Nomarski micrographs of SiC films grown by remote epitaxy over on-axis SiC substrates, with a graphene layer in between the substrate and the growing film, with SiC films grown (FIG. 3A) for 4 min and (FIG. 3B) 1 hr. Both samples were ramped in Ar to the desired growth temperature and then $H_2$ was used for the growth process instead of Ar. To achieve a smoother morphology over the on-axis substrate, samples were ramped in 50 slm Ar to a growth temperature of 1620° C. Once the growth temperature was reached, the carrier gas was changed from Ar to $H_2$ and the precursors were turned on at the same time to reduce or prevent etching of the graphene layer. At this point, all flows were increased from a growth rate of 1.5 µm/hr to 2.5 µm/hr. The sample depicted in FIG. 3A was grown for 4 min while the sample depicted in FIG. 3B was grown for 1 hr. The morphology improved for the thicker material so that the boundaries seen in FIG. 3A have been slightly reduced in FIG. 3B as the material started to grow and coalesce. One would typically have observed, previous to this study, at least some 3C—SiC grown over on-axis substrates, which 3C—SiC was advantageously not present in these samples. Accordingly, it was not expected to form such a good quality silicon carbide film on an on-axis silicon carbide substrate.

Figure 4A:
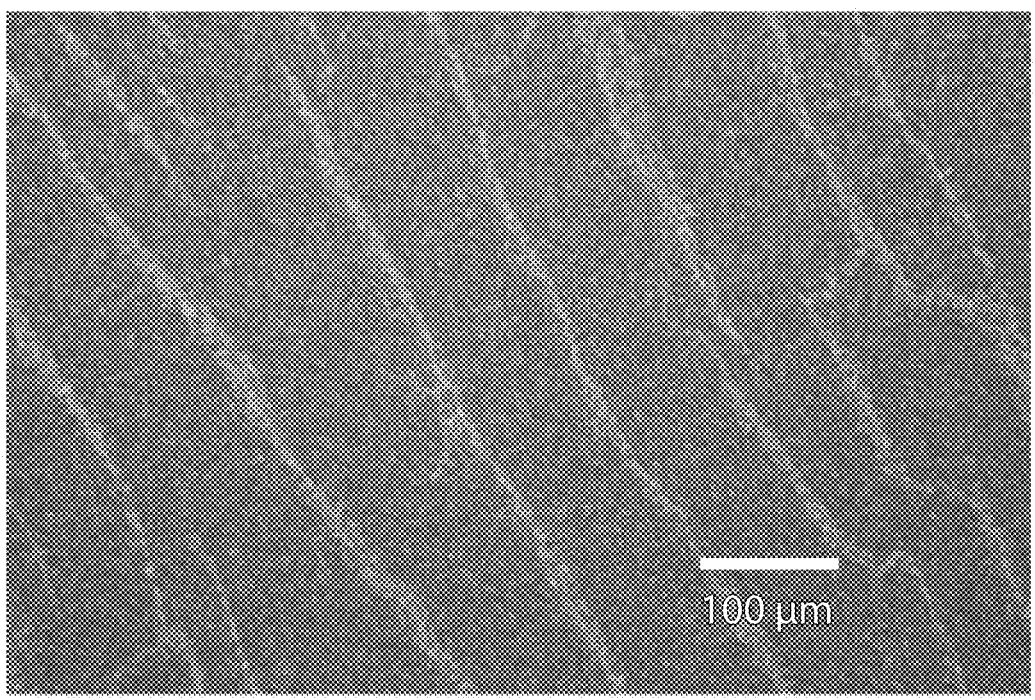
FIG. 4A is a Nomarski micrograph of a sample ramped in Argon (Ar) and grown in Ar for 10 min and then 30 min in $H_2$ at 1450° C., according to one set of embodiments.
Figure 4B:
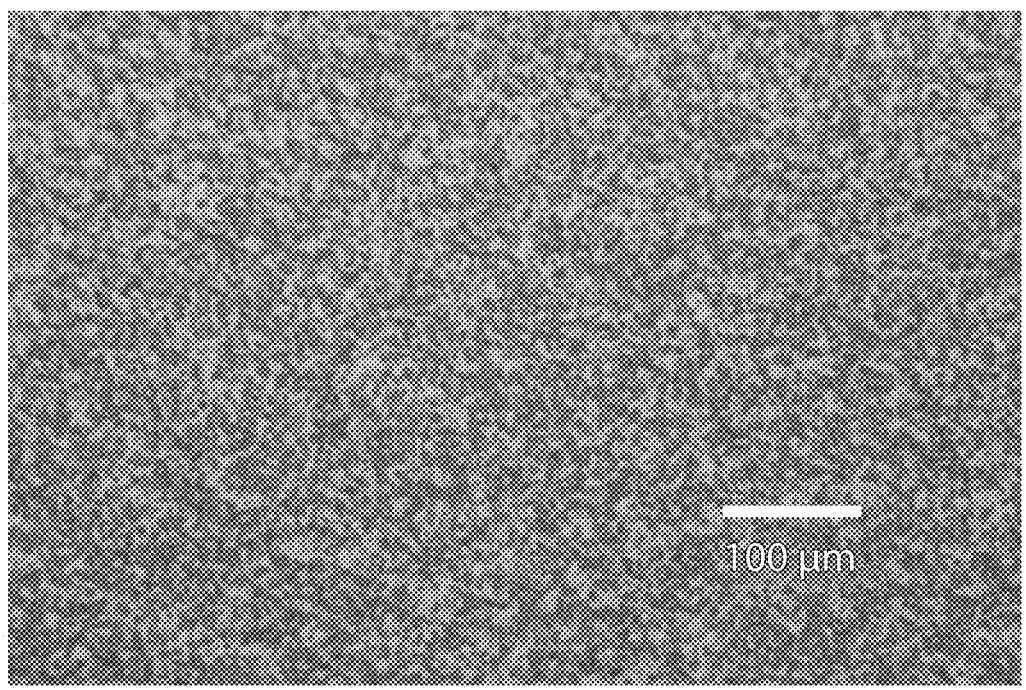
FIG. 4B is a Nomarski micrograph of a sample ramped in Ar and grown in Ar for 1 hr at 1540° C., according to one set of embodiments.
Figure 4C:
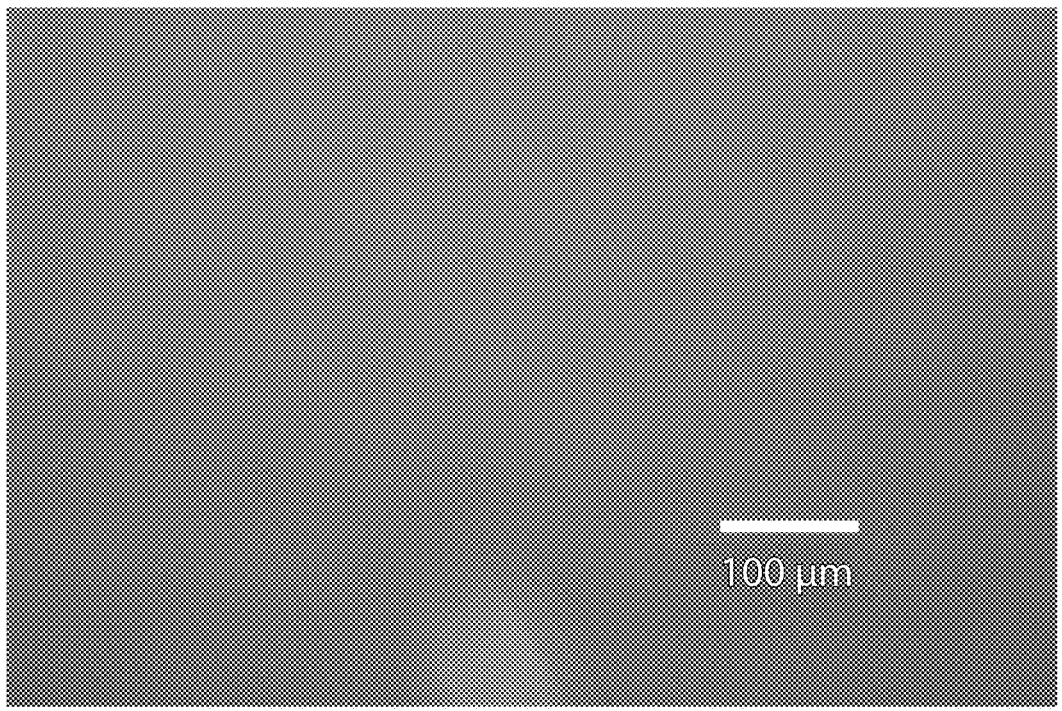
FIG. 4C is a Nomarski micrograph of a sample ramped in Ar and grown in Ar for 10 min at 1400° C., according to one set of embodiments.
Figure 4D:
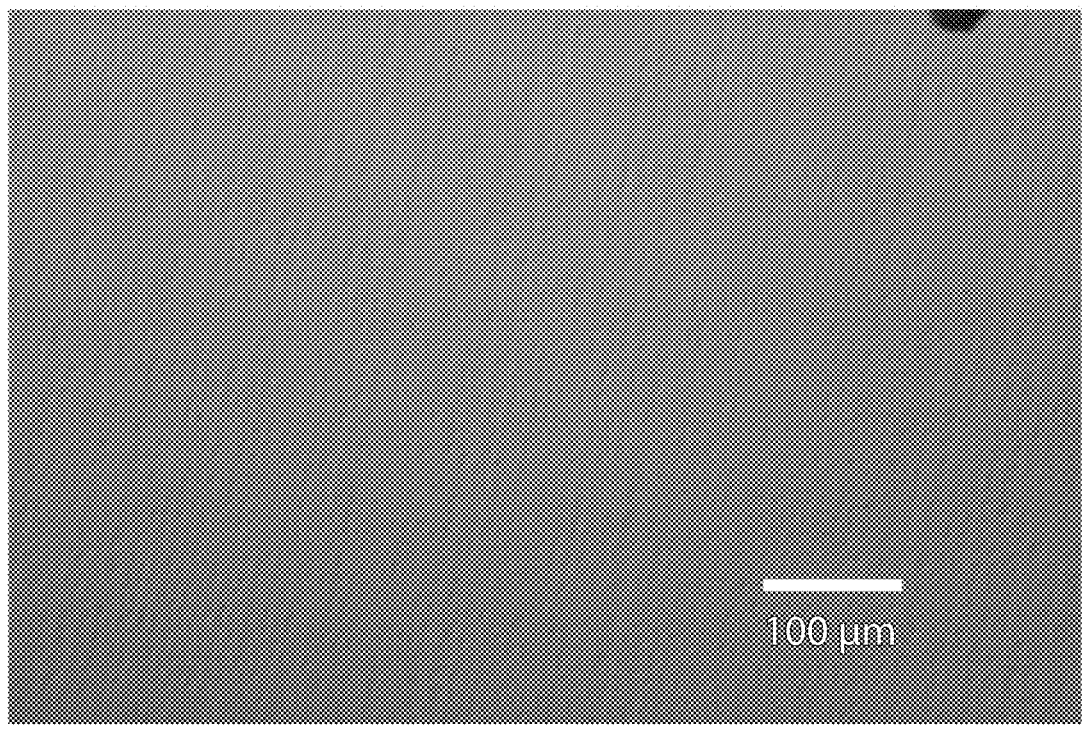
FIG. 4D is a Nomarski micrograph of a sample ramped in Ar and grown in Ar for 10 min at 1540° C., according to one set of embodiments.
Figure 5A:
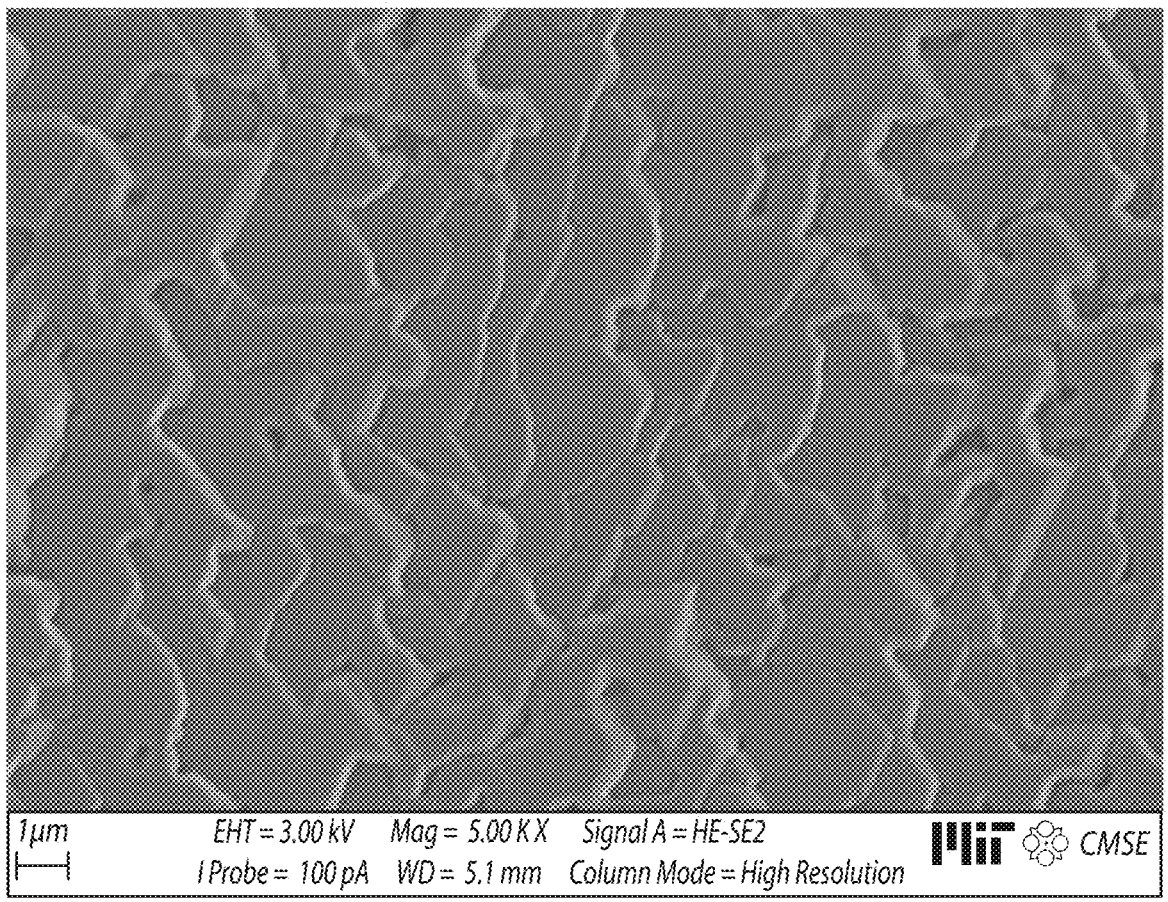
FIG. 5A is a scanning electron microscopy (SEM) image of surface morphology of a sample grown with growth conditions from FIG. 4A, according to one set of embodiments.
Figure 5B:
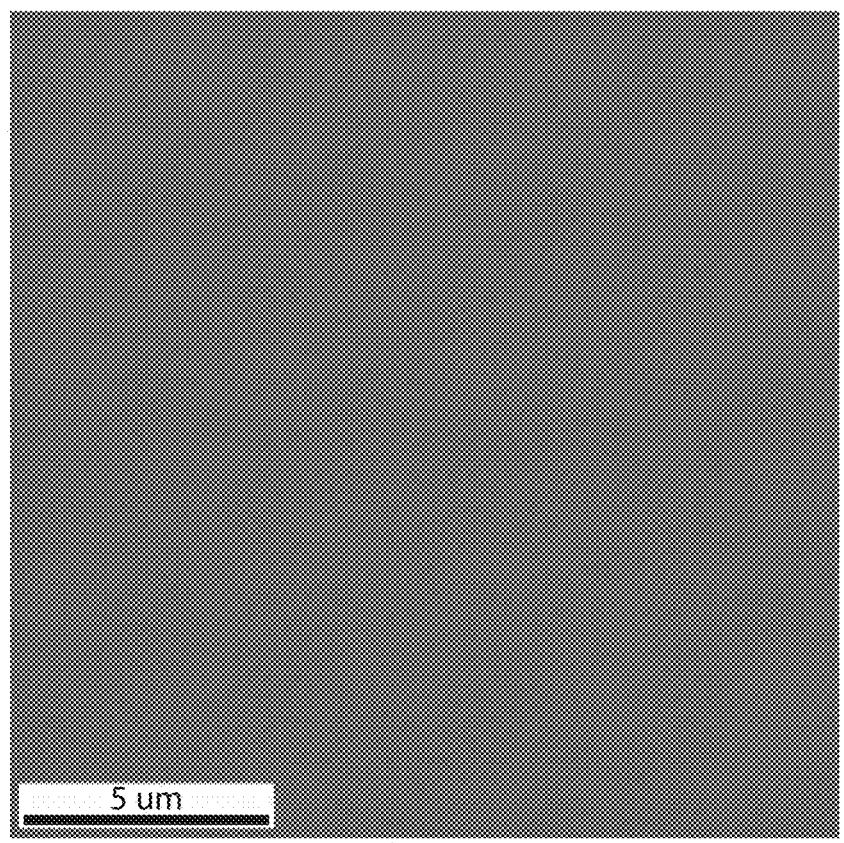
FIG. 5B is an in-plane Electron Backscatter Diffraction (EBSD) image of a sample grown with growth conditions from FIG. 4A, according to one set of embodiments.
Figure 5B:
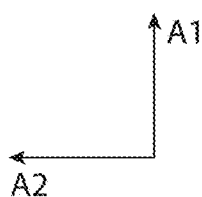
Figure 5B:
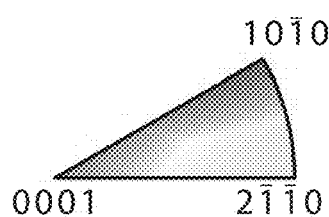
Figure 5C:
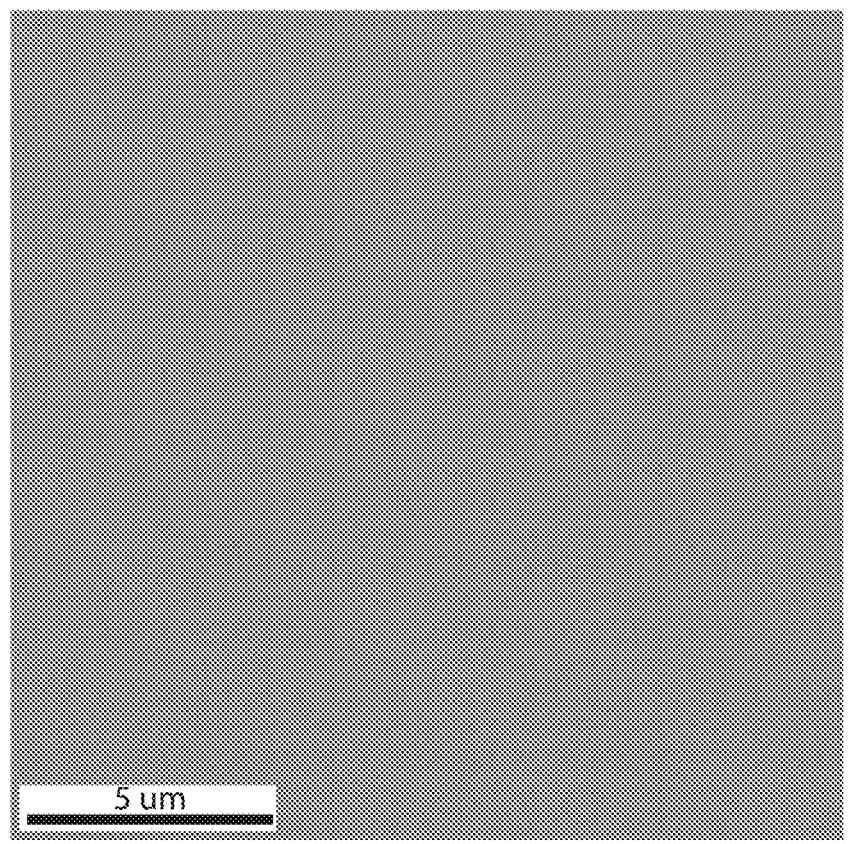
FIG. 5C is an out-of-plane EBSD image of a sample grown with growth conditions from FIG. 4A, according to one set of embodiments.
Figure 5C:
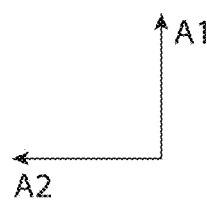
Figure 5C:
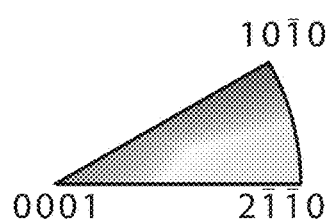
Figure 5D:
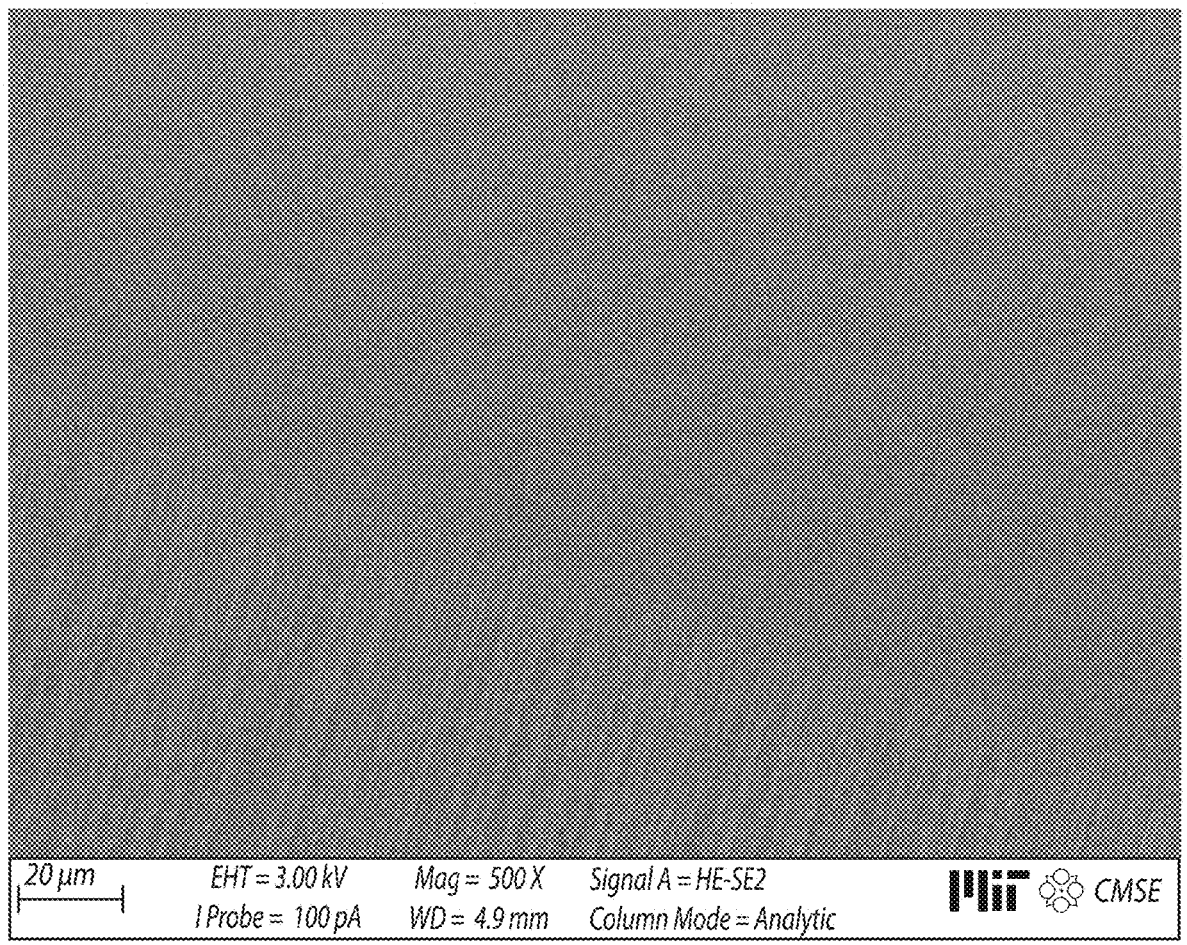
FIG. 5D is a SEM image of an exfoliated SiC film sample grown with growth conditions from FIG. 4A, according to one set of embodiments.

When ramped and grown in Ar and then switched to $H_2$ after a short growth duration, and growth temperatures were lower than for the samples typified by FIG. 3A and FIG. 3B, the exfoliation yield remained between or equal to 40% and 50%. When samples were ramped and grown in Ar, the exfoliation yield advantageously increased further to between or equal to 60% and 70%. When SiC films were grown at significantly lower temperatures (in a range of between or equal to 1350° C. and 1500° C.) compared to temperatures (in a range of between or equal to 1500° C. and 1800° C.) for standard growth of SiC, the morphology roughened and polycrystalline material was grown for some cases instead of single crystalline material. An example of this is shown in FIG. 4, where FIG. 4A was grown at 1450° C. and FIG. 4B at 1540° C. FIG. 4 shows Nomarski micrographs of samples ramped in Ar and grown in Ar for (FIG. 4A) 10 min and then 30 min in $H_2$ at 1450° C., (FIG. 4B) 1 hr at 1540° C. in Ar only, (FIG. 4C) 10 min at 1400° C. in Ar only and (FIG. 4D) 10 min at 1540° C. in Ar only. The morphology advantageously had a low concentration of grain boundaries when grown at low temperatures for short durations and with low growth rates (1.5 microns/hour (μm/hr)) as compared to the samples grown at higher growth rates (2.5 μm/hr). A growth rate of 1.5 μm/hr typically corresponded to 312 sccm of 2% silane in $H_2$, and 100% propane flowing at a rate corresponding to a typical C:Si ratio of 1.55. A growth rate of 2.5 μm/hr typically corresponded to 500 sccm of 2% silane in $H_2$, and 100% propane flowing at a rate corresponding to a typical C:Si ratio of 1.55. In FIG. 4A, SiC was grown in 50 slm Ar for 10 min and then switched to $H_2$ for 30 min at a growth rate of 1.5 μm/hr and temperature of 1450° C. In FIG. 4B, SiC was grown for 1 hr in 50 slm Ar, a growth temperature of 1540° C. and a growth rate of 2.5 μm/hr. The higher growth temperature improved the morphology, where the size of the grains was significantly larger than the size of grains grown at the lower temperature. When samples were grown in Ar for 10 min at 1400° C. (FIG. 4C) and 1540° C. (FIG. 4D), the nucleation of SiC was observed. The stepped morphology was still present. Morphologies with an advantageously low concentration of grain boundaries were grown at the lower temperatures (see FIG. 4C and FIG. 4D) when grown at a low growth rate (1.5 μm/hr) and for a short duration. At least for reasons discussed elsewhere herein, it was not expected to form such a good quality silicon carbide film (e.g., FIG. 4D) on an on-axis silicon carbide substrate.

For the sample depicted in FIG. 4A, SEM was taken (FIG. 5A) of the sample and it was clear that there were grain boundaries across the surface of the grown SiC film. While there were grain boundaries, it was found with Electron Backscatter Diffraction (EBSD) (see FIG. 5B and FIG. 5C) that this SiC film was single polytype in both (FIG. 5B) in-plane and (FIG. 5C) out-of-plane reflections. FIG. 5 shows (FIG. 5A) SEM image of surface morphology, (FIG. 5B) in-plane and (FIG. 5C) out-of-plane EBSD image and (FIG. 5D) SEM image of exfoliated SiC of a sample grown with growth conditions from FIG. 4A. The material was advantageously single crystalline as determined from the EBSD.

Single crystalline silicon carbide films that are free of grain boundaries may be free of the different stresses and defects that would otherwise be present at the grain boundaries. Devices including single crystalline silicon carbide films may have superior performance to devices comprising silicon carbide films that are polycrystalline and/or have more than one polytype. A single polytype may be desirable at least because each polytype has different electrical properties, which may impact device performance. If different polytypes are present in the silicon carbide film, then the electrical performance may vary across the film, which may not be desirable.

This sample depicted in FIG. 5 was initially grown at 1450° C. for 10 min in 50 slm Ar and then grown for an additional 30 min in $H_2$ with a growth rate of 1.5 μm/hr. This sample was exfoliated and there was some evidence of spalling that occurred as seen in FIG. 5D, where the image shown is the exfoliated material. The lines in the bottom left of the image are spalling evidence. However, exfoliation still took place even with spalling occurring.

Figure 6:
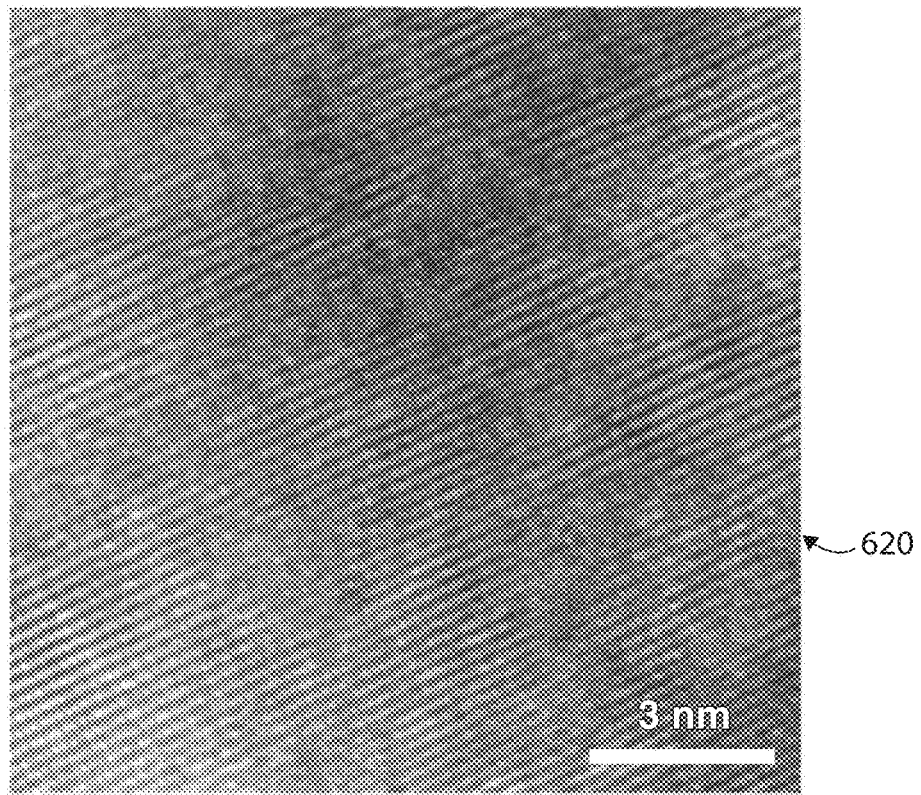
FIG. 6 is a high resolution transmission electron microscopy (HRTEM) image (top) showing pseudo graphene (see, e.g., bottom reference figure) after SiC film growth by remote epitaxy, according to one set of embodiments.
Figure 6:
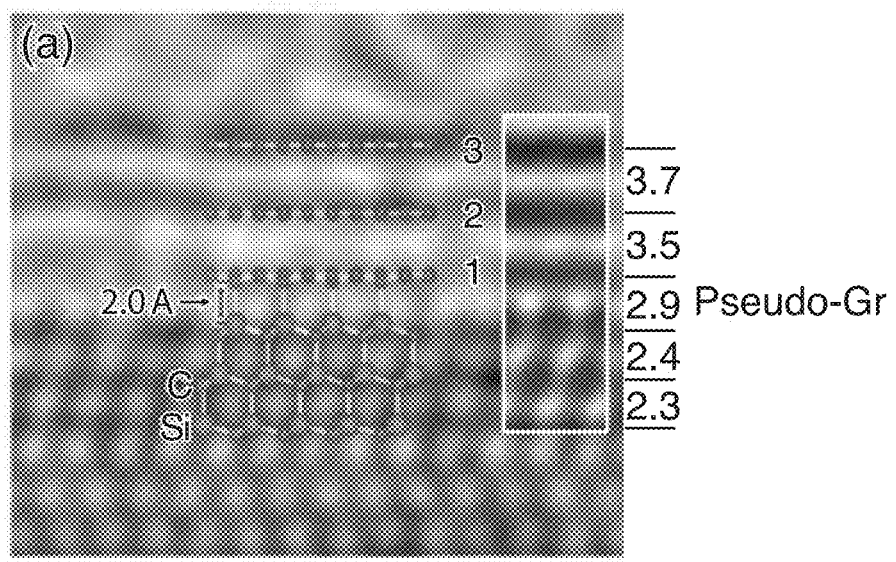
Figure 7A:
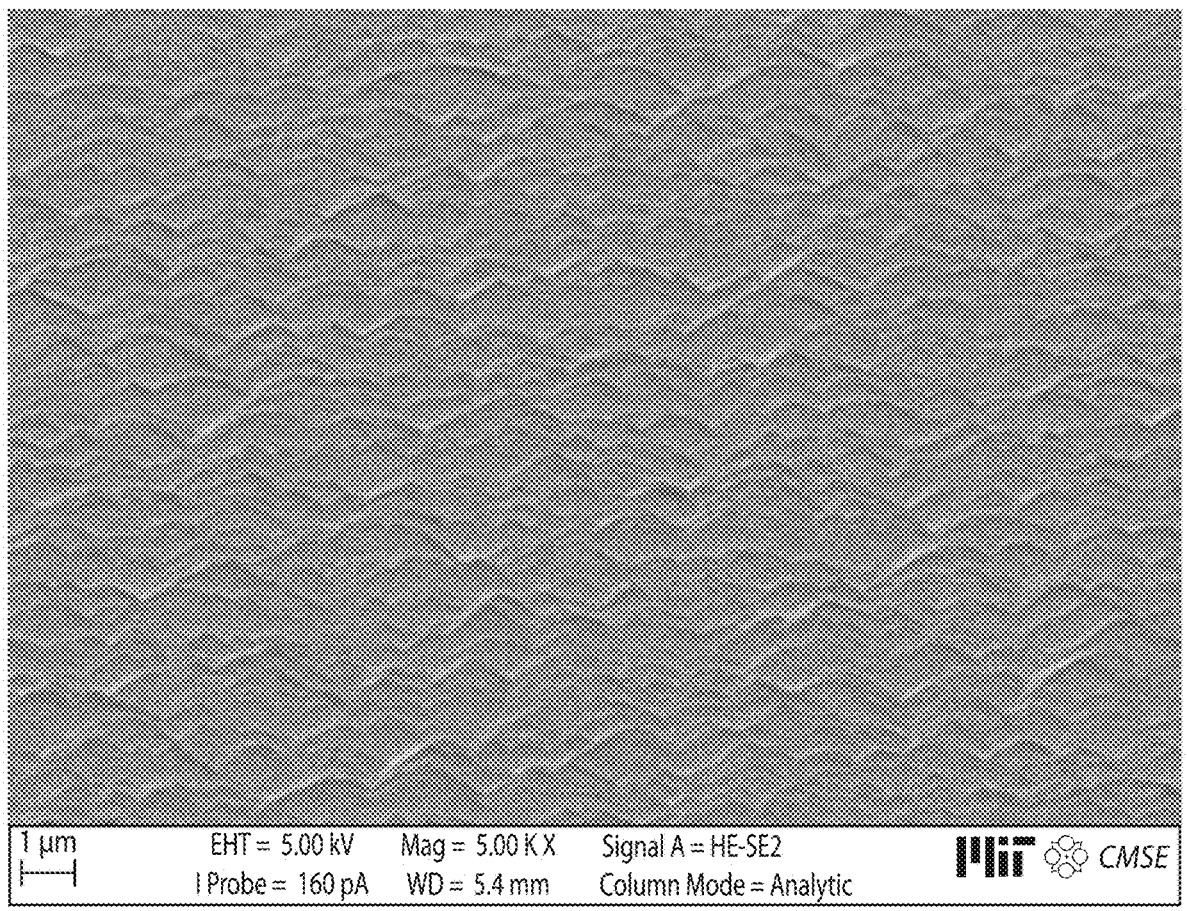
FIG. 7A is a SEM image of a sample grown at 1620° C. for 20 min in 50 slm Ar over a 4° off-axis substrate, according to one set of embodiments.
Figure 7B:
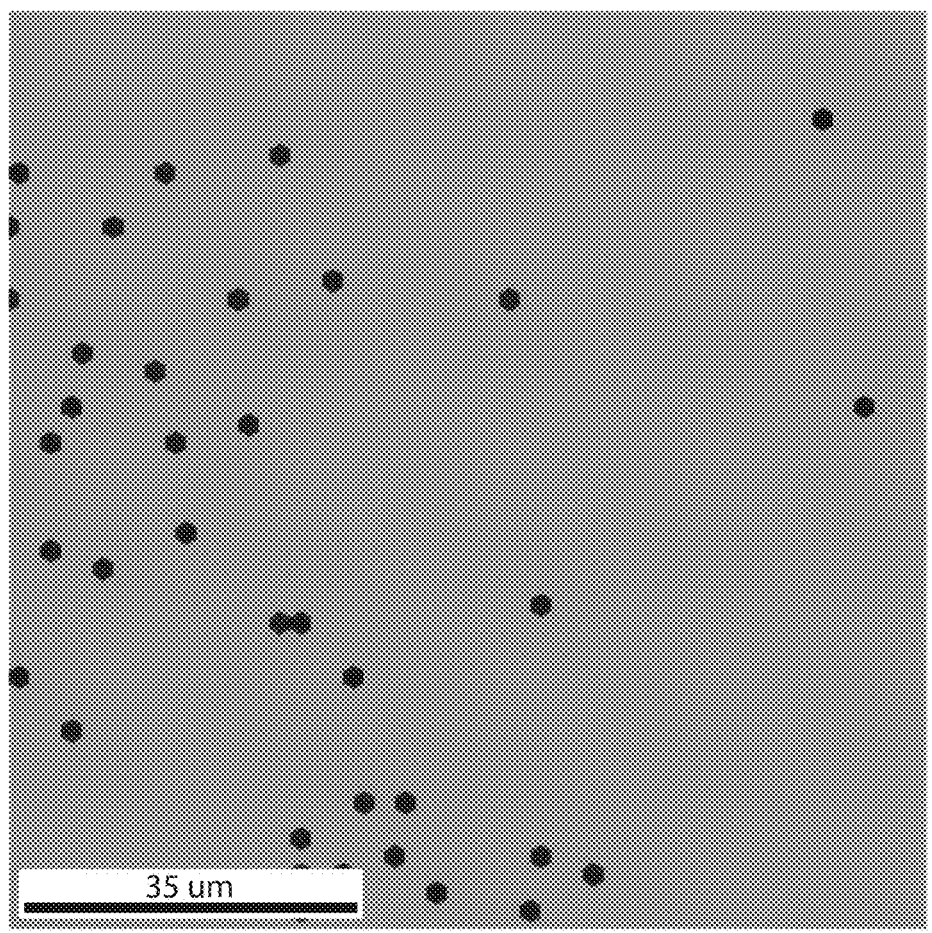
FIG. 7B is an EBSD image of a sample grown at 1620° C. for 20 min in 50 slm Ar over a 4° off-axis substrate, according to one set of embodiments.
Figure 7C:
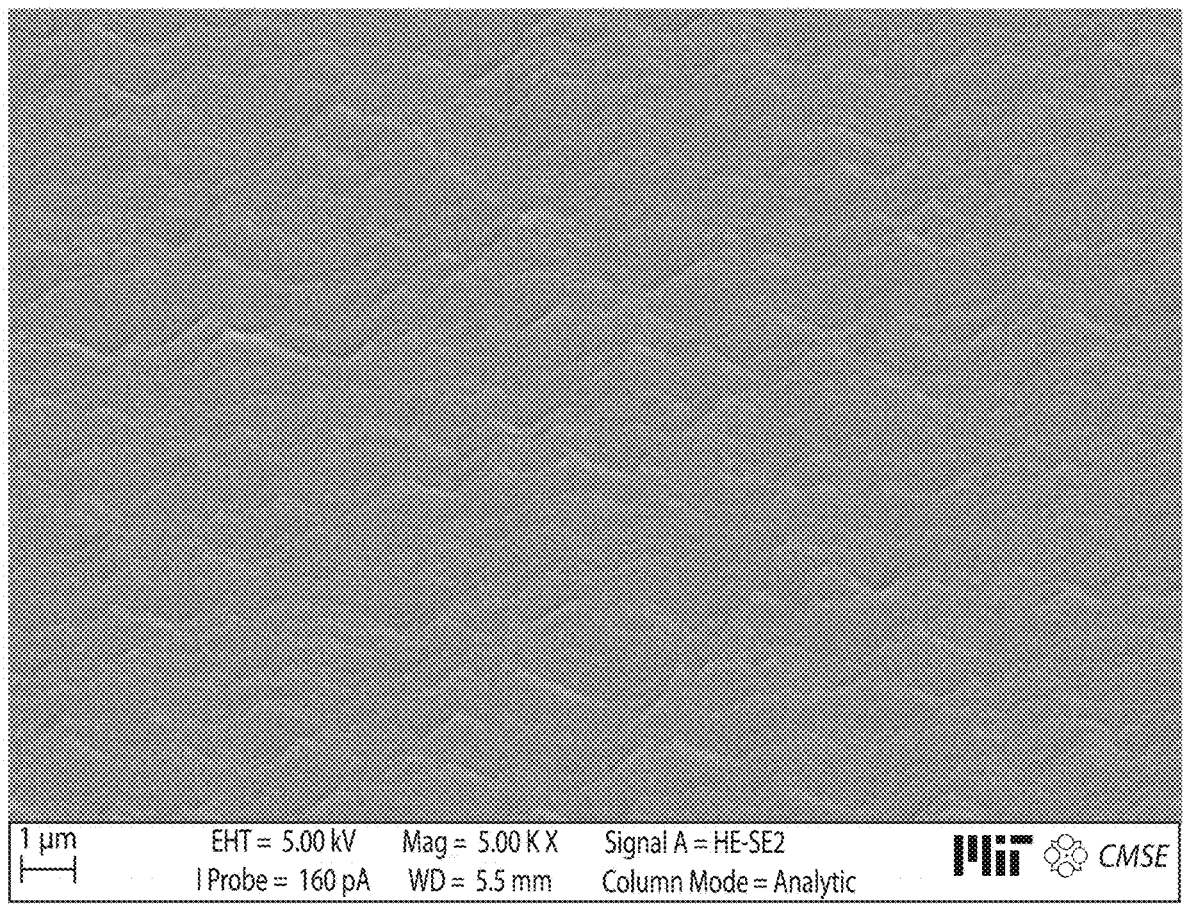
FIG. 7C is a SEM image of a sample grown at 1620° C. for 20 min in 50 slm Ar over a 2° off-axis substrate, according to one set of embodiments.
Figure 7D:
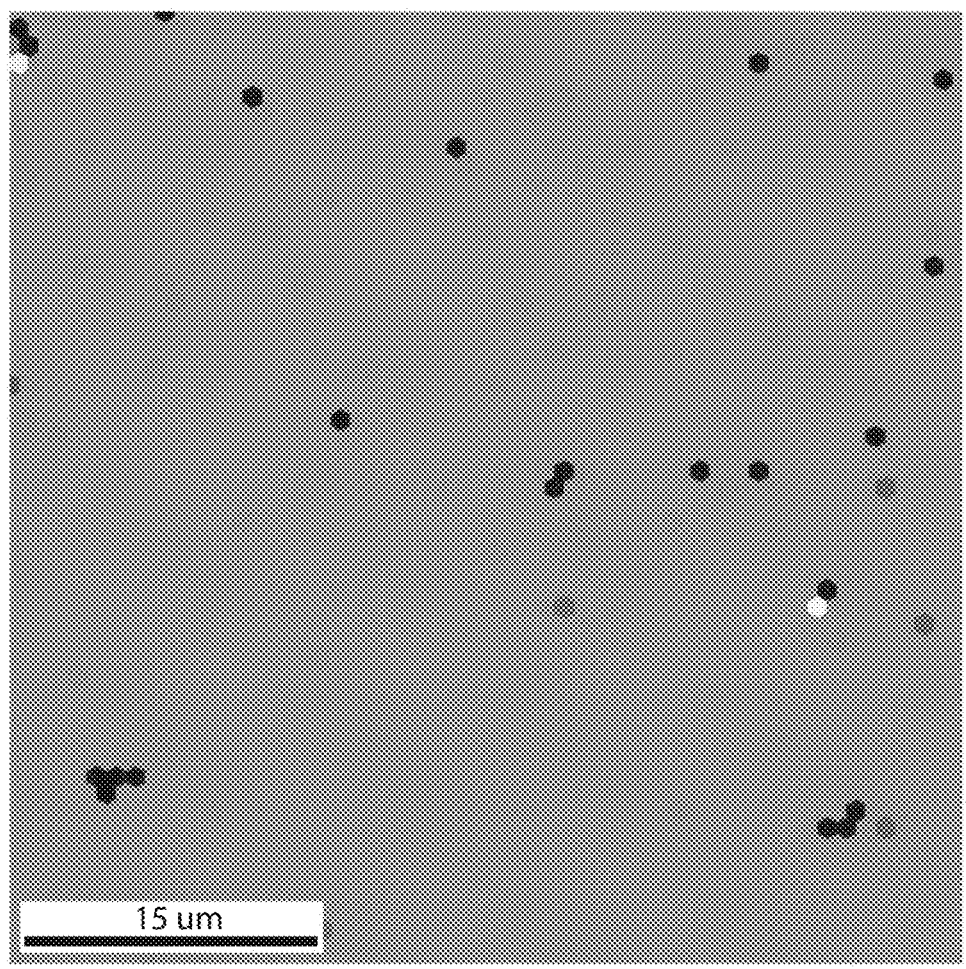
FIG. 7D is an EBSD image of a sample grown at 1620° C. for 20 min in 50 slm Ar over a 2° off-axis substrate, according to one set of embodiments.
Figure 7D:
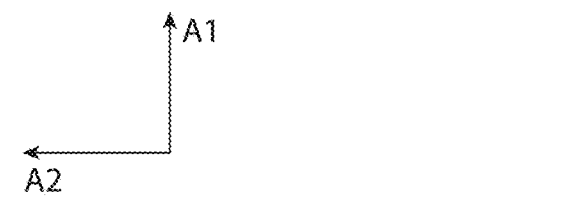
Figure 7E:
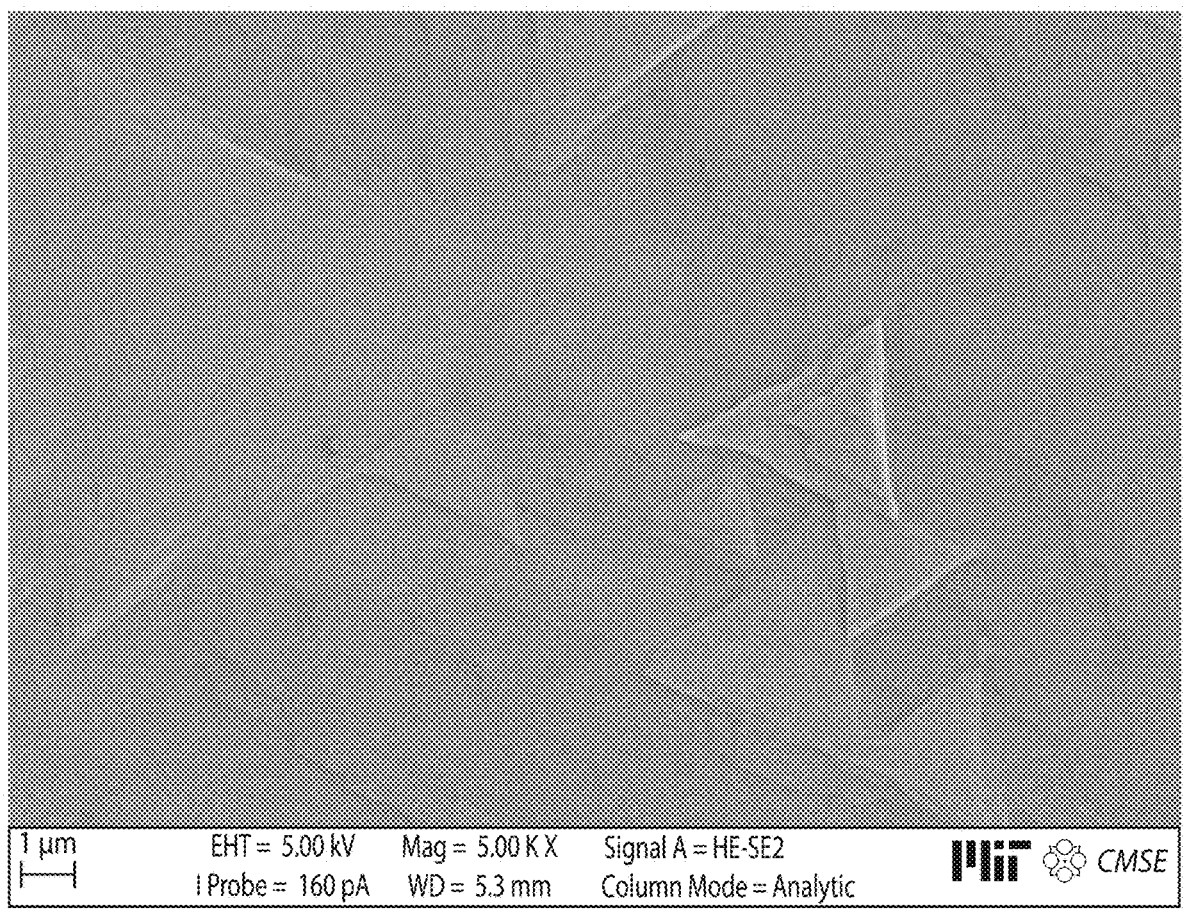
FIG. 7E is a SEM image of a sample grown at 1620° C. for 20 min in 50 slm Ar over an on-axis substrate, according to one set of embodiments.
Figure 7F:
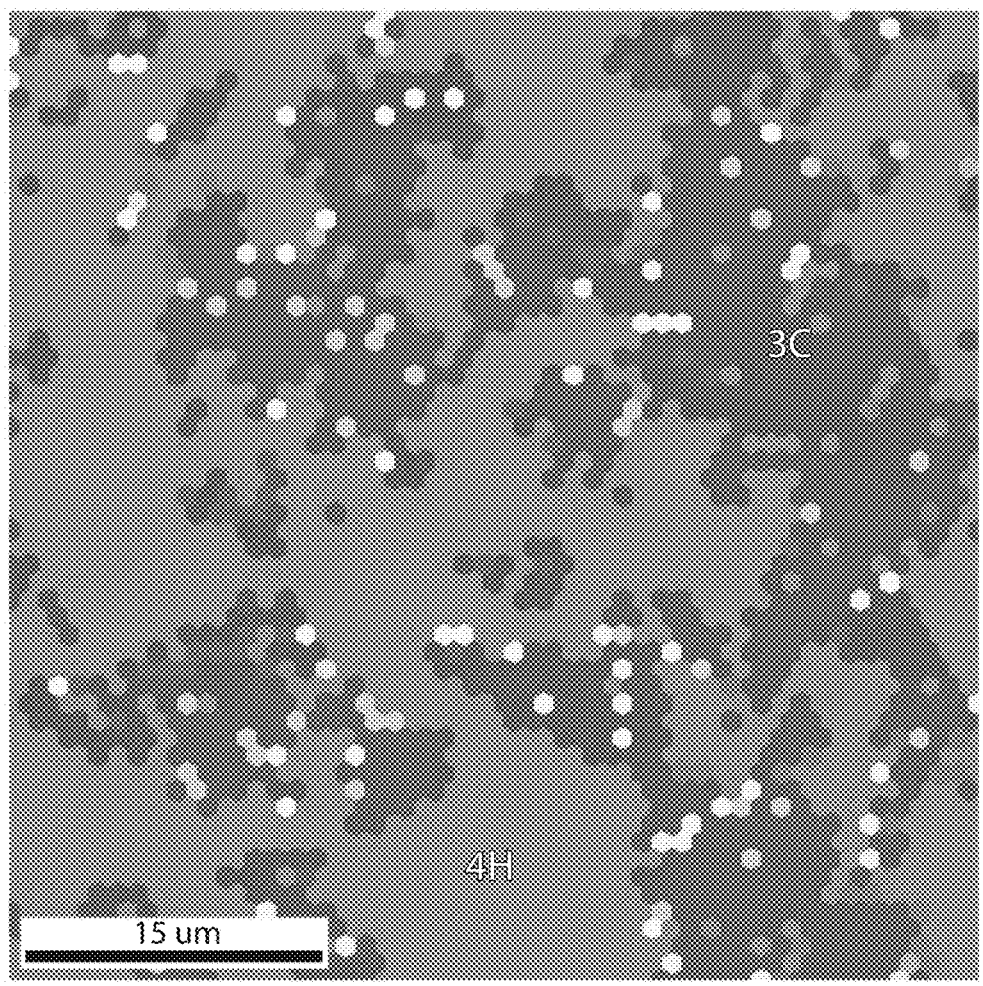
FIG. 7F is an EBSD image of a sample grown at 1620° C. for 20 min in 50 slm Ar over an on-axis substrate, according to one set of embodiments.
Figure 7F:
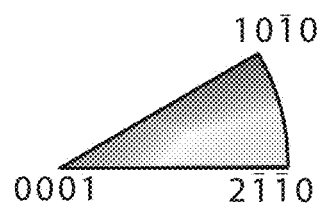

In the samples shown in FIG. 4 and FIG. 5 which were grown over on-axis substrates, there was still evidence of pseudo graphene present with a SiC film on top, as determined via high resolution transmission electron microscopy (HRTEM), see e.g., FIG. 6. FIG. 6 is an HRTEM image (top) showing that there was pseudo graphene present (see, e.g., bottom reference figure) after SiC film growth by remote epitaxy. The bottom reference figure shows pseudo graphene, which figure is adapted from Norimatsu W., et al, "Transitional structures of the interface between graphene and 6H—SiC (0001)," Chemical Physics Letters 468 (2009) 52-56, incorporated herein by reference. As shown in FIG. 6, there was a dislocation 202 in the substrate at the bottom right of the HRTEM image (top) that was not present in the SiC film grown by remote epitaxy. This HRTEM supports that there was pseudo graphene present after the growth of a SiC film by remote epitaxy, allowing exfoliation of the SiC film from the substrate.

When samples were grown in Ar at 1620° C., the morphology was roughened as seen in FIG. 7 SEM images. FIG. 7 shows SEM and EBSD of samples grown at 1620° C. for 20 min in 50 slm Ar over (FIG. 7A-FIG. 7B) 4° off-axis, (FIG. 7C-FIG. 7D) 2° off-axis and (FIG. 7E-FIG. 7F) on-axis substrates. The morphology was roughened for the higher offcut material (e.g., FIG. 7A) and there were mixed polytypes for the on-axis growth (e.g., FIG. 7F). The substrate off-cut was varied in these samples for a comparison of SiC film remote epitaxy growth over on-axis substrates (FIG. 7E-FIG. 7F), 2° off-axis substrates (FIG. 7C-FIG. 7D), and 4° off-axis substrates (FIG. 7A-FIG. 7B). As seen (FIG. 7A and FIG. 7C), the morphology was wavy for the two off-axis substrates, but the on-axis (FIG. 7E) had triangular features indicating 3C—SiC. Samples depicted in FIG. 7A and FIG. 7C had a particularly favorable crystal structure; each had no grain boundaries and consisted essentially of one polytype. Using EBSD, it was determined that the off-axis material produced single crystal 4H—SiC material (FIG. 7B and FIG. 7D) while the on-axis had a mixture of 4H—SiC and 3C—SiC (FIG. 7F).

Figure 8A:
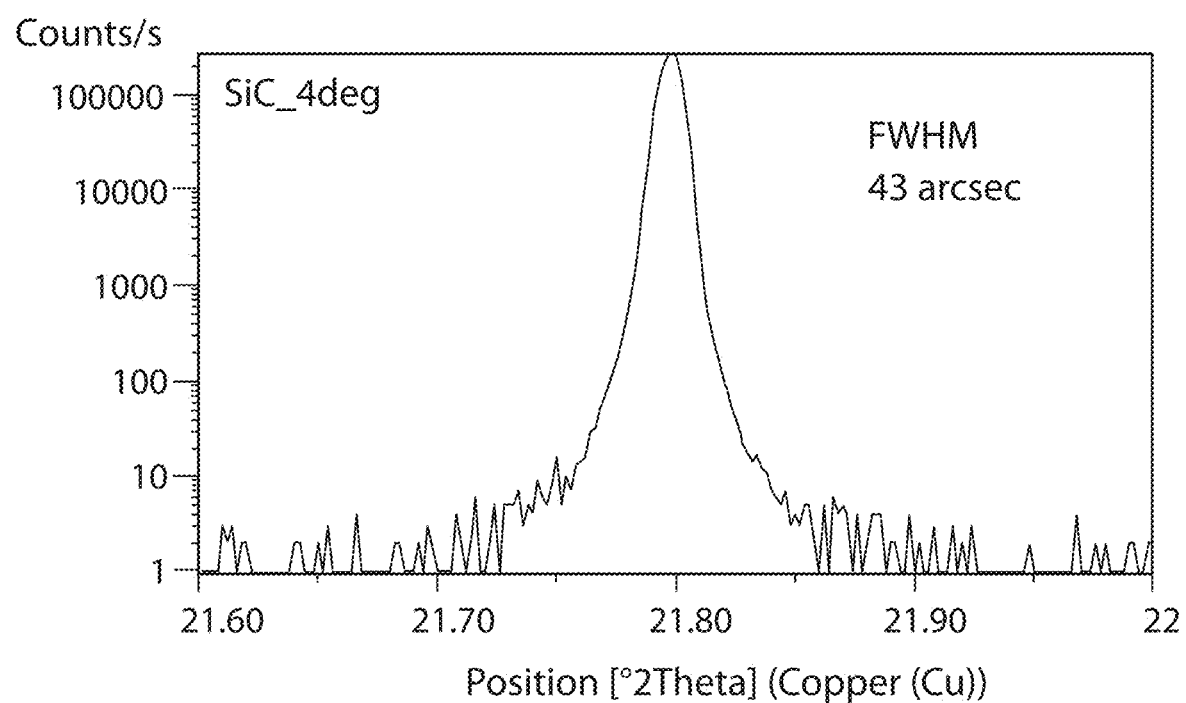
FIG. 8A is an X-ray Diffraction (XRD) rocking curve of the (002) and (004) for SiC grown over a 4° off-axis substrate, according to one set of embodiments.
Figure 8B:
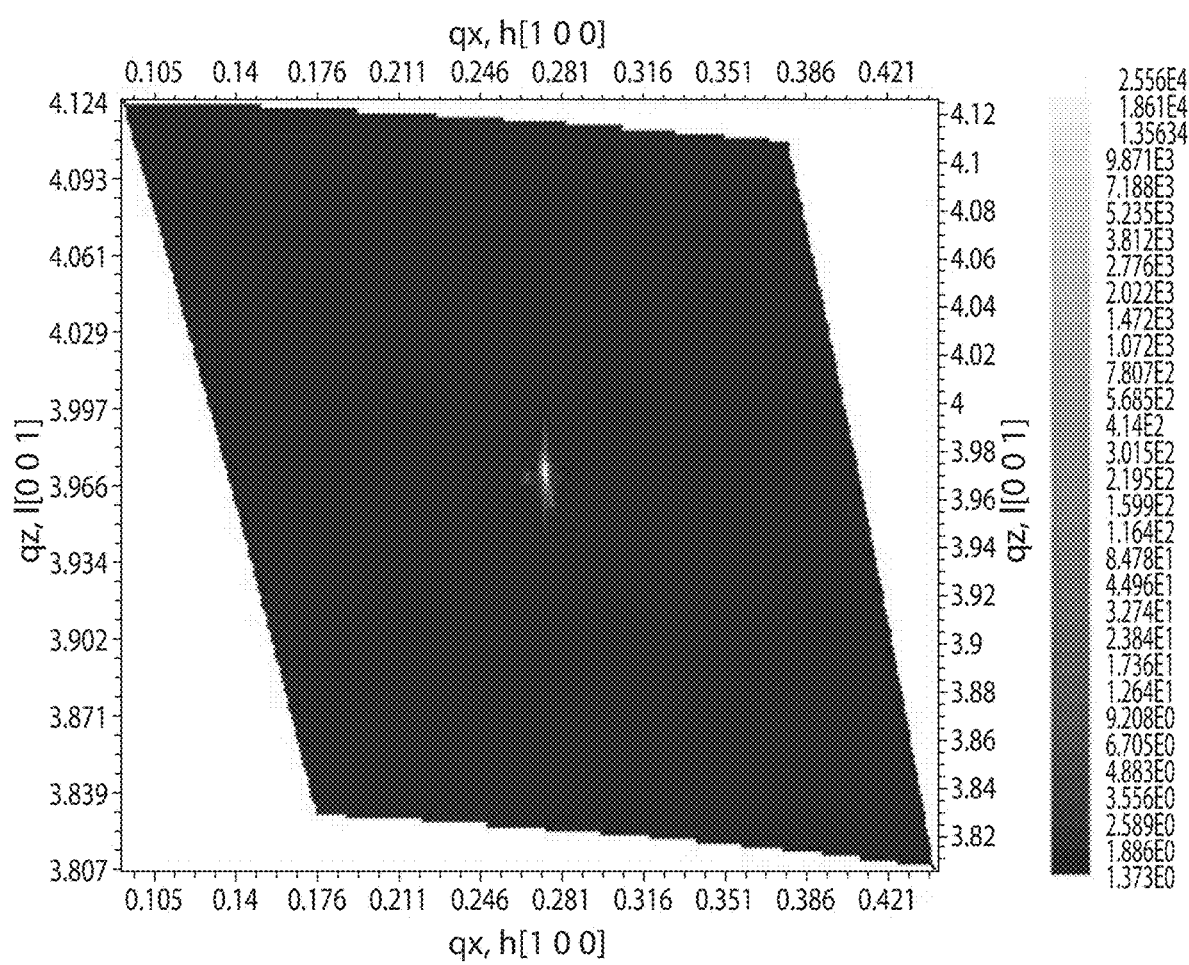
FIG. 8B is an XRD reciprocal space map (RSM) of the (004) for SiC grown over a 4° off-axis substrate, according to one set of embodiments.
Figure 8C:
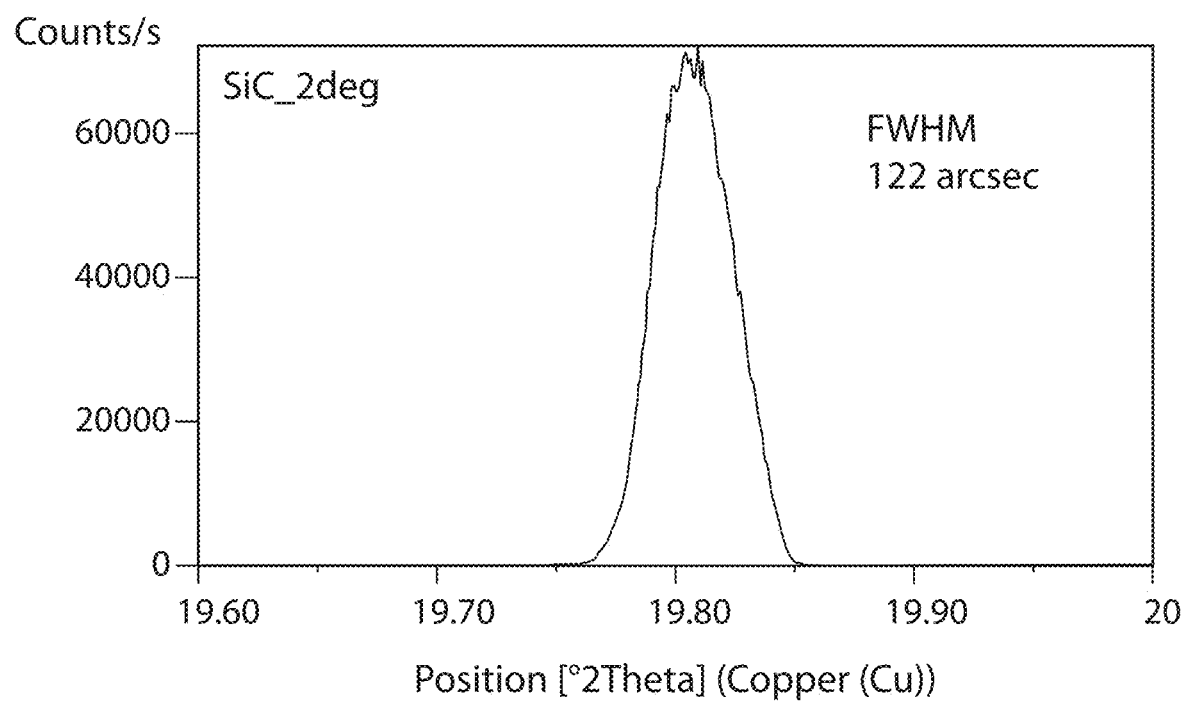
FIG. 8C is an XRD rocking curve of the (002) and (004) for SiC grown over a 2° off-axis substrate, according to one set of embodiments.
Figure 8D:
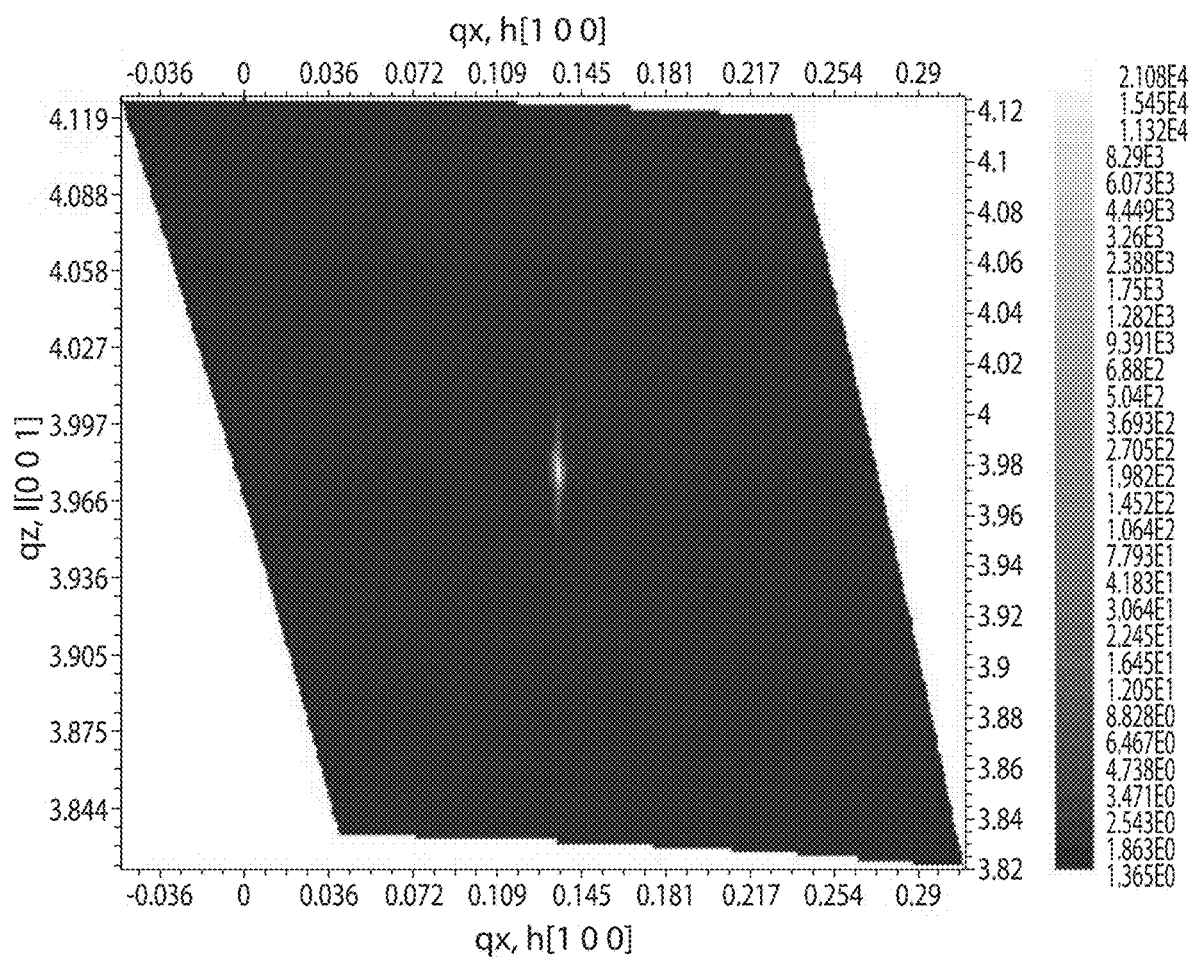
FIG. 8D is an XRD RSM of the (004) for SiC grown over a 2° off-axis substrate, according to one set of embodiments.
Figure 8E:
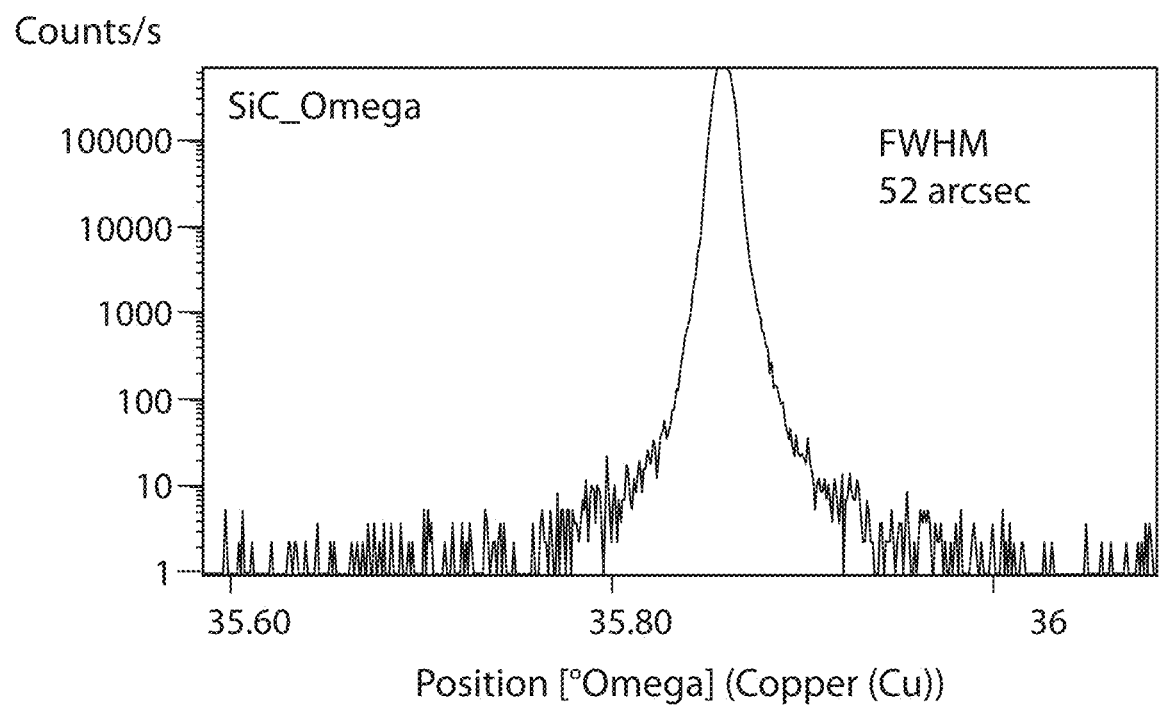
FIG. 8E is an XRD rocking curve of the (002) and (004) for SiC grown over an on-axis substrate, according to one set of embodiments.
Figure 8F:
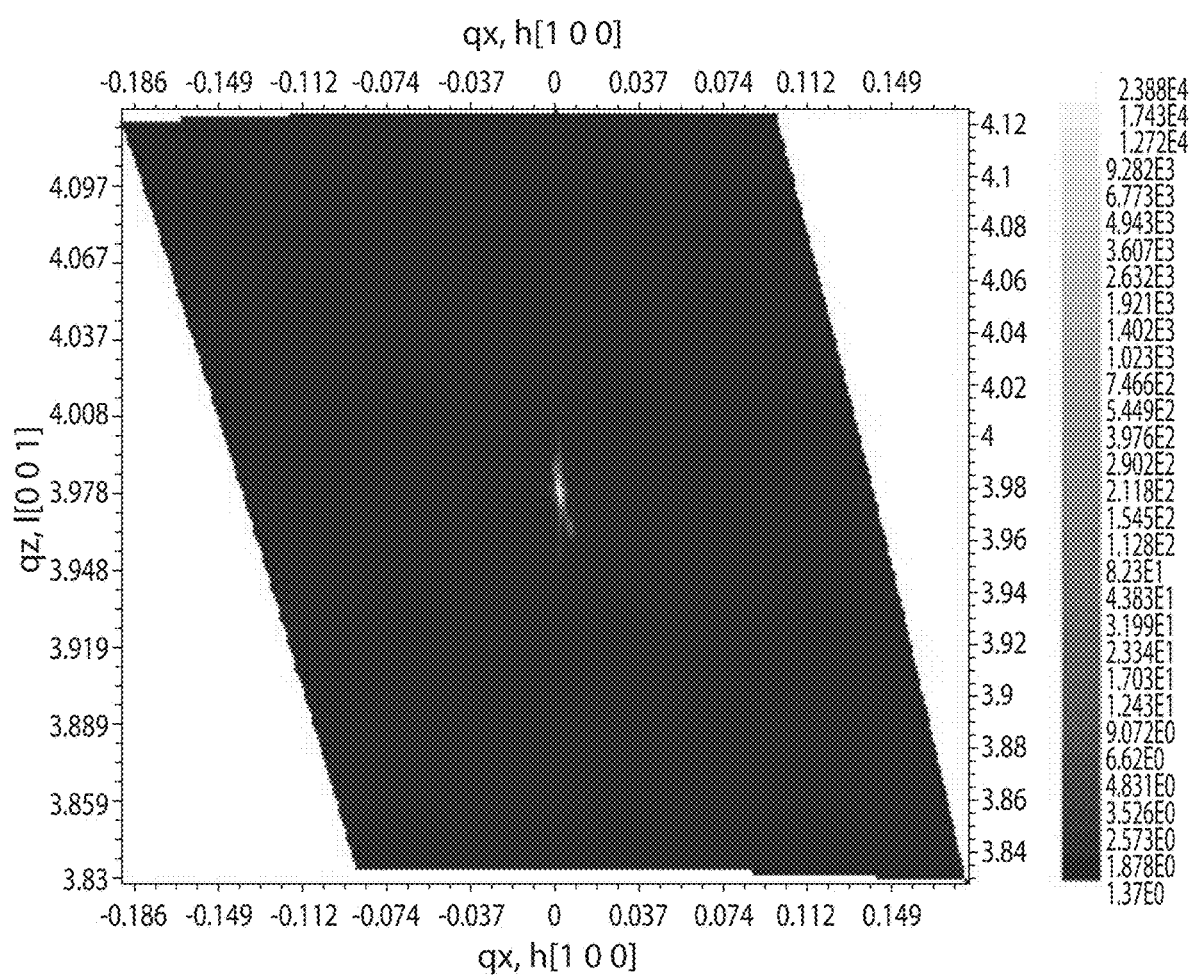
FIG. 8F is an XRD RSM of the (004) for SiC grown over an on-axis substrate, according to one set of embodiments.

The quality of these SiC films depicted in FIG. 7 was determined to be high, as investigated by X-ray diffraction (XRD) rocking curves and by XRD reciprocal space maps (RSM). FIG. 8 shows XRD rocking curves of the (002) and (004) for (FIG. 8A) 4° off-axis substrates, (FIG. 8C) 2° off-axis substrates, and (FIG. 8E) on-axis substrates and RSM of the (004) for (FIG. 8B) 4° off-axis substrates, (FIG. 8D) 2° off-axis substrates, and (FIG. 8F) on-axis substrates. FIG. 8 shows results for samples grown over 4° off-axis substrates (FIG. 8A-FIG. 8B), 2° off-axis substrates (FIG. 8C-FIG. 8D) and on-axis (FIG. 8E-FIG. 8F) substrates in Ar at 1620° C. The narrowest FWHM (XRD rocking curve) sample was grown over the 4° off-axis substrate (FIG. 8A), the second narrowest was for the on-axis (FIG. 8E) and the widest was produced over the 2° off-axis substrate (FIG. 8C). The RSMs for all of the samples (FIG. 8B, FIG. 8D, FIG. 8F) showed to have no spread in the kx (x-axis) indicating these were high quality SiC films, along with the FWHM being relatively narrow for the thicknesses that were grown, <2 μm of SiC film.

Figure 9:
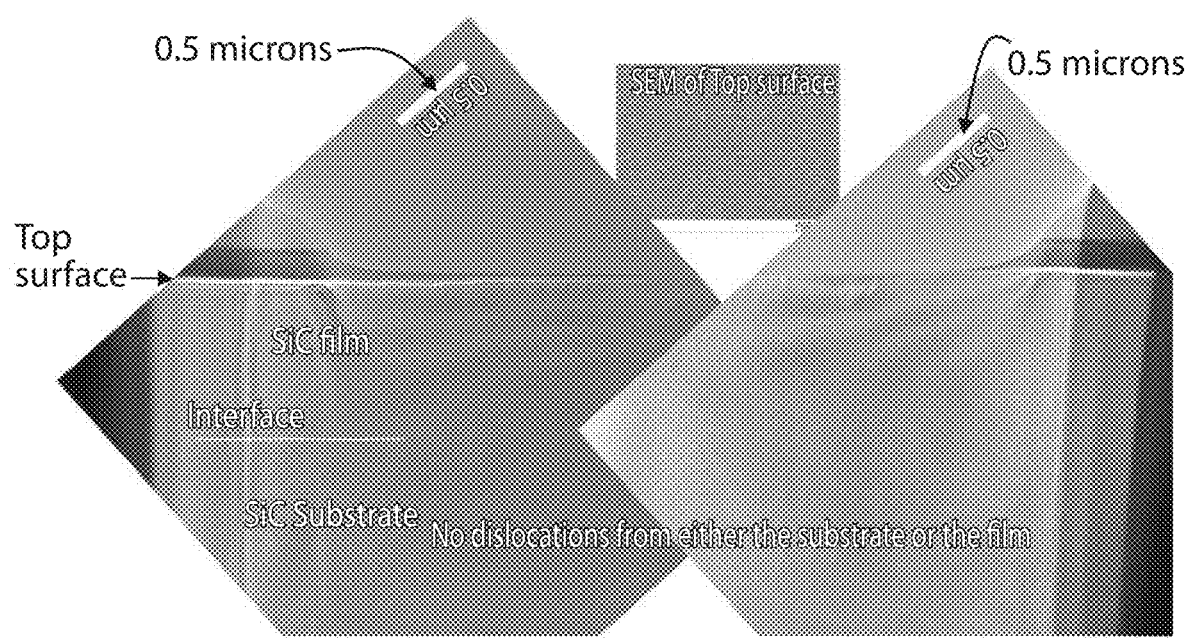
FIG. 9 is transmission electron microscopy (TEM) images (left and right), and an SEM image (center) corresponding to FIG. 7A, of an SiC film grown by remote epitaxy on a 4° off-axis substrate in Ar at 1620° C., according to one set of embodiments.

The presence (or density) or absence of dislocations of SiC films depicted in FIG. 7-FIG. 8 was investigated by TEM, and no dislocations were observed. Using the process of growing in Ar for 20 min at 1620° C. and looking at the sample grown over 4° off-axis substrates, there were no dislocations in the SiC film, see e.g., FIG. 9. FIG. 9 shows TEM images (left and right) and an SEM image (center) of an SiC film grown by remote epitaxy on a 4° off-axis substrate in Ar at 1620° C. This indicated that growing a SiC film via a remote epitaxy process reduced and/or eliminated dislocations in the SiC film, which may greatly benefit devices.

The samples grown and described in FIG. 7-FIG. 9 were exfoliated, and exfoliation yield was between or equal to 60% and 70%. Results of exfoliation are shown in FIG. 10, where a SiC film was grown at 1620° C. in Ar over each of 4° off-axis substrates (FIG. 10A-FIG. 10B), 2° off-axis substrates (FIG. 10C-FIG. 10D), and on-axis (FIG. 10E-

Figure 10A:
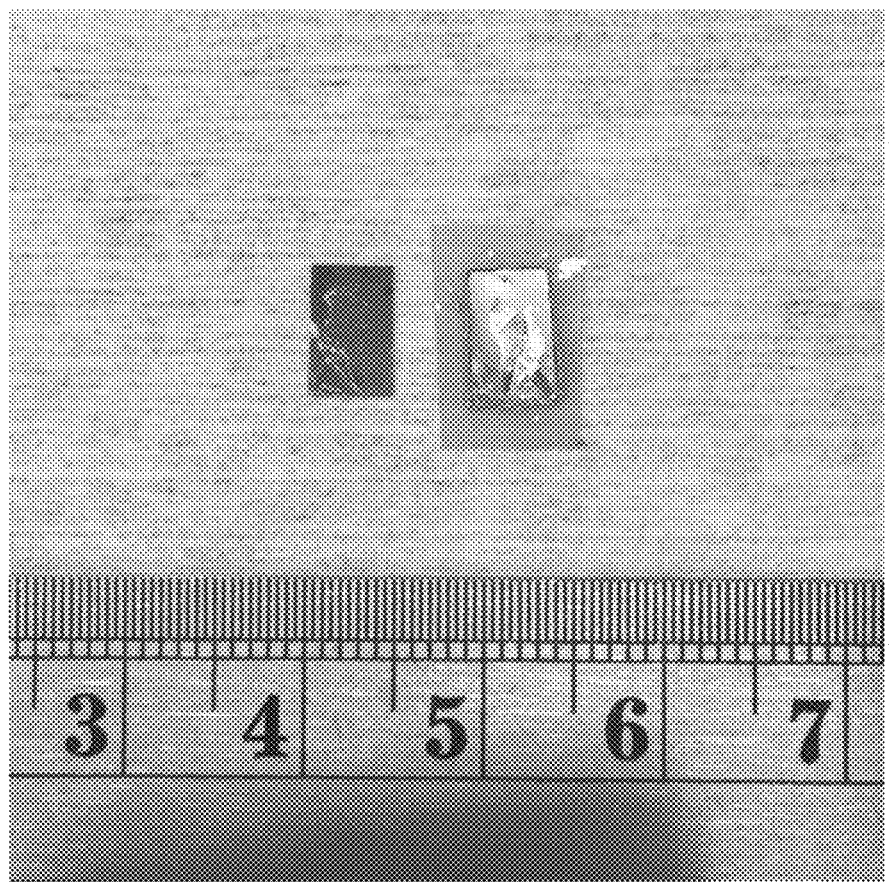
FIG. 10A is a photograph of an exfoliated SiC film grown by remote epitaxy at 1620° C. in Ar over a 4° off-axis substrate, according to one set of embodiments.
Figure 10B:
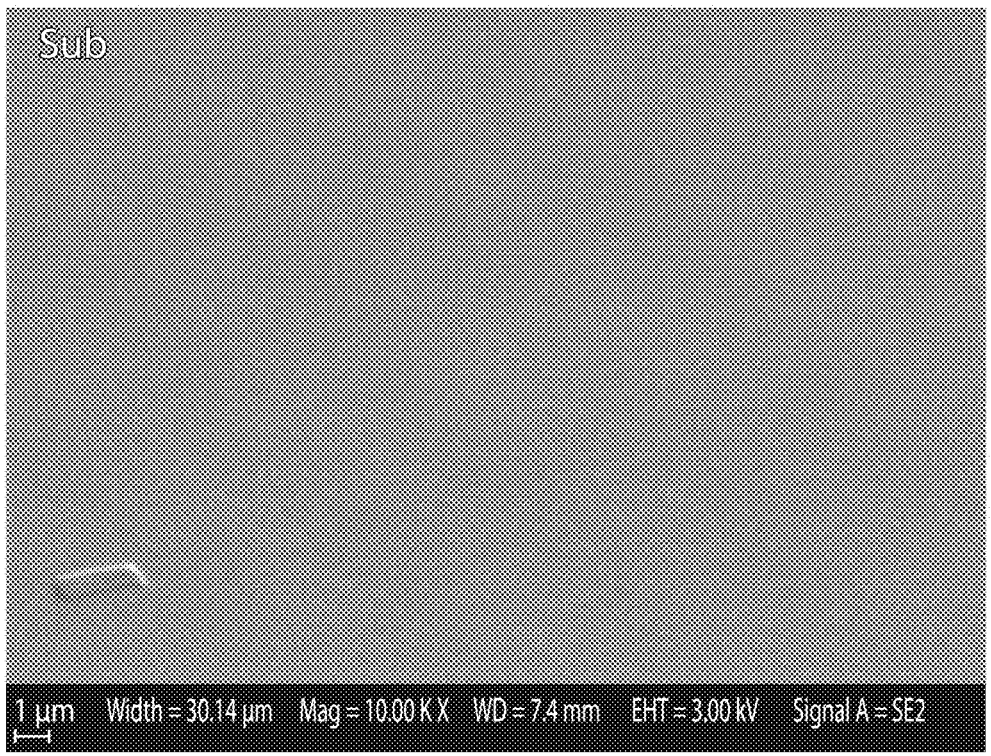
FIG. 10B is an SEM image ("sub", top) of a substrate after exfoliation and an SEM image ("tape", bottom) of an exfoliated SiC film grown by remote epitaxy at 1620° C. in Ar over a 4° off-axis substrate, according to one set of embodiments.
Figure 10B:
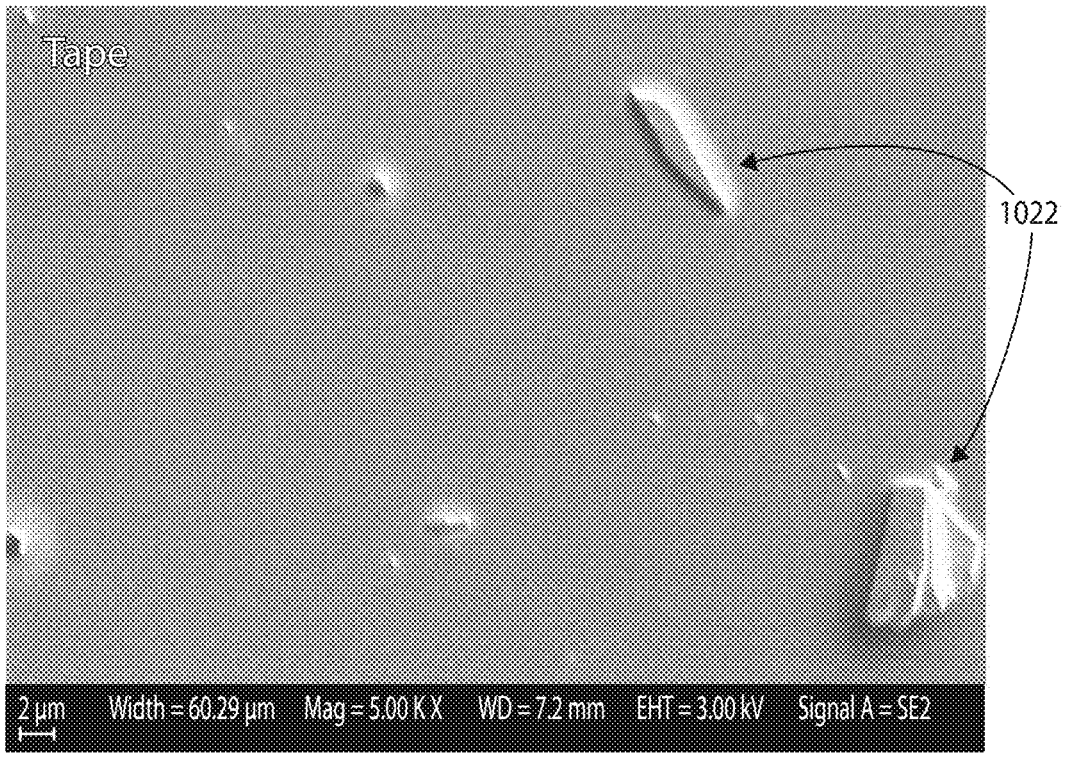
Figure 10C:
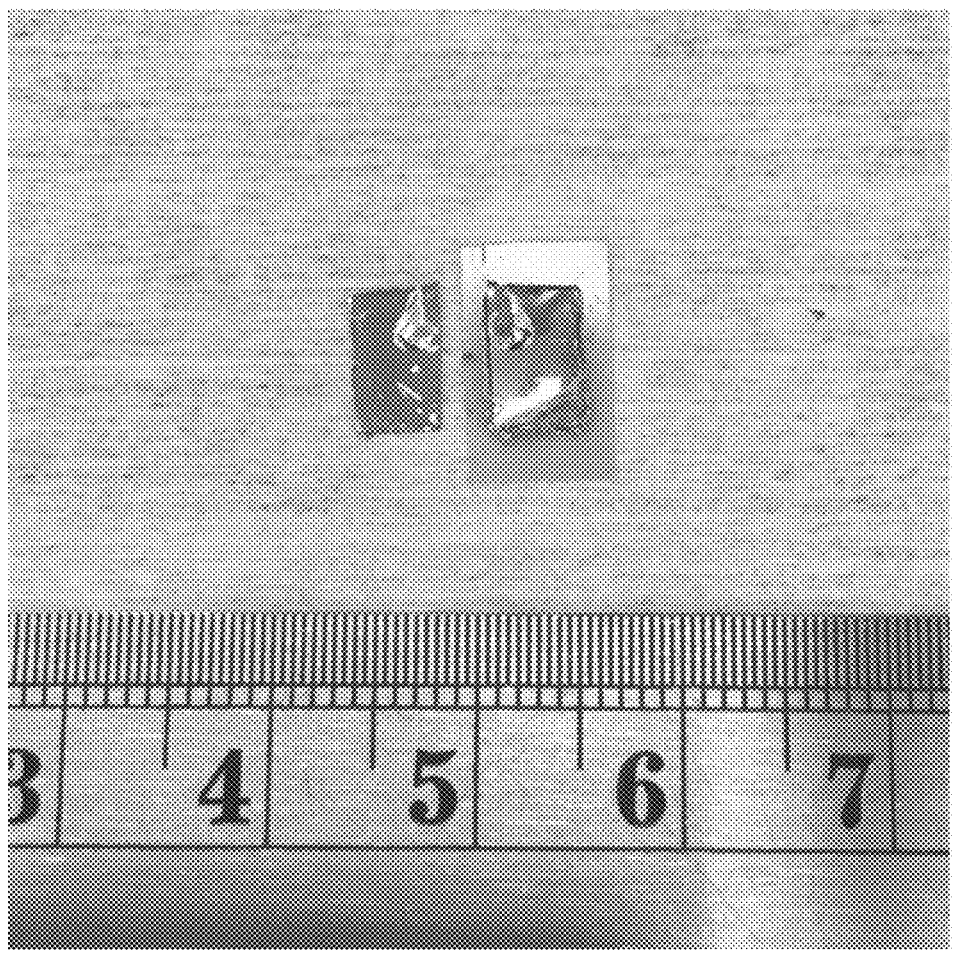
FIG. 10C is a photograph of an exfoliated SiC film grown by remote epitaxy at 1620° C. in Ar over a 2° off-axis substrate, according to one set of embodiments.
Figure 10D:
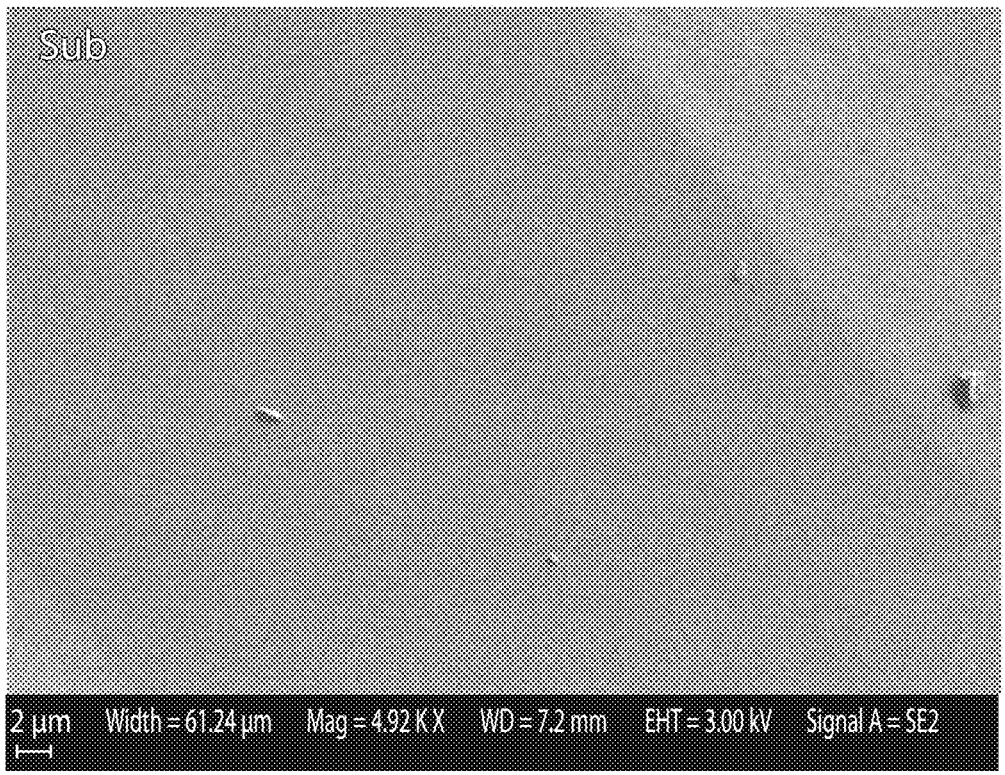
FIG. 10D is an SEM image ("sub", top) of a substrate after exfoliation and an SEM image ("tape", bottom) of an exfoliated SiC film grown by remote epitaxy at 1620° C. in Ar over a 2° off-axis substrate, according to one set of embodiments.
Figure 10D:
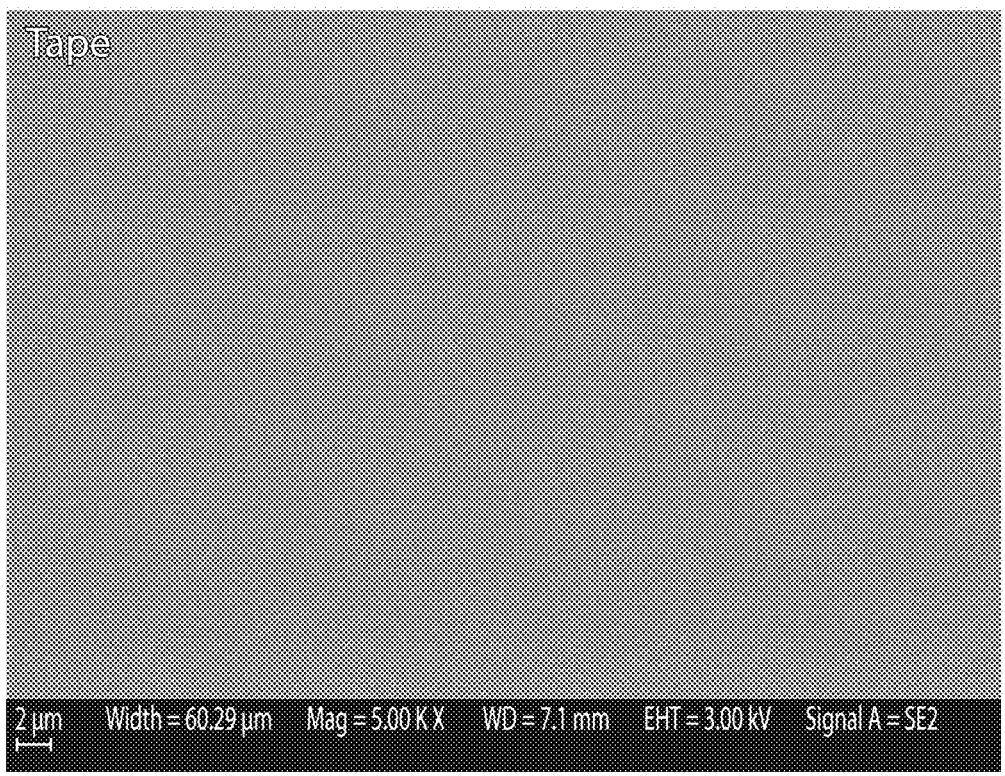
Figure 10E:
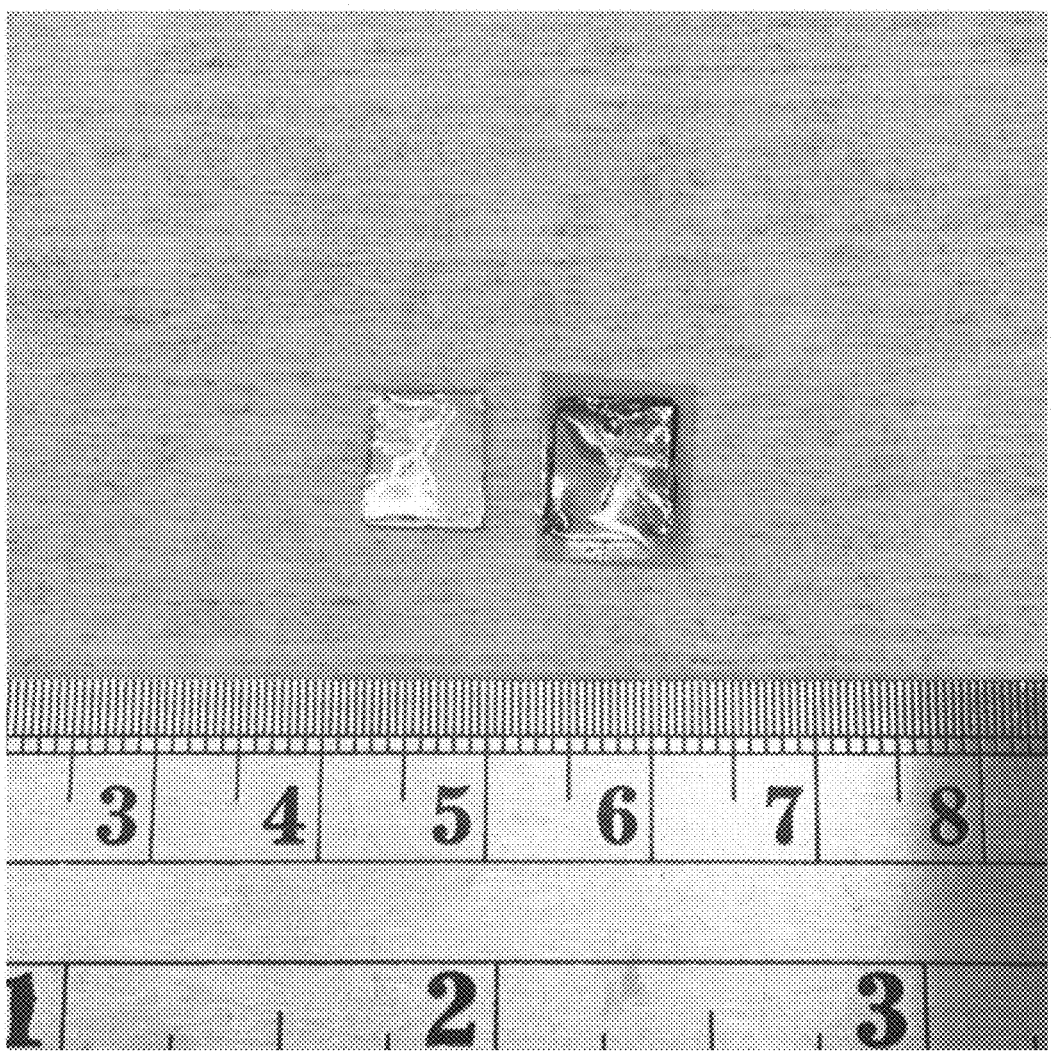
FIG. 10E is a photograph of an exfoliated SiC film grown by remote epitaxy at 1620° C. in Ar over an on-axis substrate, according to one set of embodiments.
Figure 10F:
FIG. 10F is an SEM image ("sub", top) of a substrate after exfoliation and an SEM image ("tape", bottom) of an exfoliated SiC film grown by remote epitaxy at 1620° C. in Ar over an on-axis substrate, according to one set of embodiments.

FIG. 10F) substrates. FIG. 10 shows photographs and SEM images of exfoliated SiC films grown by remote epitaxy at 1620° C. in Ar over (FIG. 10A-FIG. 10B) 4° off-axis, (FIG. 10C-FIG. 10D) 2° off-axis, and (FIG. 10E-FIG. 10F) on-axis substrates. The photograph images for each (FIG. 10A, FIG. 10C, FIG. 10E) show the substrate on the left and the transferred SiC film grown by remote epitaxy on the right. The SEM images (FIG. 10B, FIG. 10D, FIG. 10F) also show the same, where the substrate ("sub") after exfoliation is the top SEM image and the bottom SEM image is the exfoliated SiC film grown by remote epitaxy ("tape"). Spalling did occur in these films when transferred (see, e.g., spalling marks 1022 in FIG. 10B), but transfer was still demonstrated.

From exfoliation trials, it was found that when samples were ramped in Ar, grown for a short duration in Ar and then switched to $H_2$ flow for the remainder of growth, the exfoliation yield was between or equal to 40% and 50%. When samples were ramped and grown in Ar, the exfoliation yield increased to between or equal to 60% and 70%.

For the growth of SiC films by remote epitaxy, a SiC film was grown on a graphene layer that was Si sublimated from SiC, and then the SiC film was removed and/or transferred to a desired substrate. The process is scalable for manufacturing purposes, as 4" (10.16 cm) wafers were exfoliated. SiC films were grown on (graphene layer)/SiC over on-axis substrates with good morphology and single crystallinity. Previously to this study, when growth of SiC had taken place over on-axis SiC substrates, there had generally been a combination of island and step flow growth, which did not happen with this process. Along with these benefits, the SiC films had fewer dislocations than in the substrate, as the dislocations did not propagate into SiC films grown by remote epitaxy. Without wishing to be bound by theory, this was also likely the case for extended defects such as basal plane dislocations, which would favorably impact epitaxial SiC film quality for device applications.

A particularly useful feature to this process was ramping in Ar to reduce or eliminate etching of a graphene layer. If one were to grow a SiC film by ramping to a growth temperature and growing using $H_2$ as the carrier gas, there would have been no remote epitaxy as most or all of the graphene layer would have been etched away and one would just be growing a SiC film on a SiC substrate. In order to grow a SiC film by remote epitaxy, the graphene samples were ramped in a high flow rate of Ar and then SiC film growth either took place in Ar, or started in Ar flow for a short duration and then switched to $H_2$. Otherwise, exfoliation of the grown SiC film did not occur. When samples were ramped and grown in a $H_2$ carrier gas, exfoliation yield was 0%. However, when ramped and grown in Ar and then switched to $H_2$ after a short growth duration, the exfoliation yield increased to between or equal to 40% and 50%. When a sample was ramped and grown in Ar, the exfoliation yield increased further to between or equal to 60% and 70%.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, and/or method described herein. In addition, any combination of two or more such features, systems, articles, materials, and/or methods, if such features, systems, articles, materials, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A method, comprising:
    forming a silicon carbide (SiC) film over a layer comprising graphene and/or hexagonal boron nitride (hBN) that is over a substrate, wherein the SiC film is single crystalline;
    wherein at least a portion of the formation of the SiC film occurs in the presence of a gaseous material comprising an inert gas, and
    wherein, during the forming of the SiC film, the temperature of an environment of the layer comprising the graphene and/or hBN over the substrate is ramped from a first temperature to a second, higher temperature, wherein the first temperature and the second temperature are greater than or equal to 1350° C. and less than or equal to 1800° C.

2. The method of claim 1, wherein the inert gas comprises Argon, Helium, and/or nitrogen ($N_2$).

3. The method of claim 1, wherein the inert gas comprises Argon.

4. The method of claim 1, further comprising separating the SiC film and the substrate.

5. The method of claim 4, wherein the SiC film is a first SiC film, and further comprising forming a second SiC film over the substrate after the first SiC film and the substrate have been separated.

6. The method of claim 1, wherein forming the SiC film over the layer comprises using the substrate as a seed for the SiC film.

7. The method of claim 1, wherein a surface of the substrate over which the layer is positioned during growth is a SiC surface.

8. The method of claim 1, wherein the substrate is a semiconductor substrate.

9. The method of claim 1, wherein the substrate is made, in whole or in part, of SiC having an offcut angle of between or equal to 0° and 10°.

10. The method of claim 1, wherein the substrate is made, in whole or in part, of (0001) 4H—SiC and/or (0001) 6H—SiC.

11. The method of claim 1, wherein the environment of the layer comprising the graphene and/or hBN over the substrate further comprises the gaseous material comprising the inert gas, wherein a flow rate of the gaseous material is between or equal to 10 standard liters per minute (slm) and 80 slm.

12. The method of claim 1, wherein the substrate is made, in whole or in part, of a III-Nitride.

13. The method of claim 1, wherein the second temperature is greater than or equal to 1620° C. and less than or equal to 1800° C.

14. The method of claim 1, further comprising forming the layer over the substrate.

15. The method of claim 14, wherein forming the layer over the substrate comprises growing the layer over the substrate.

16. The method of claim 1, wherein the layer is single crystalline.

* * * * *